(12) United States Patent
Kuo et al.

(10) Patent No.: US 11,450,641 B2
(45) Date of Patent: Sep. 20, 2022

(54) METHOD OF FABRICATING PACKAGE STRUCTURE

(71) Applicant: Taiwan Semiconductor Manufacturing Company, Ltd., Hsinchu (TW)

(72) Inventors: Hung-Jui Kuo, Hsinchu (TW); Hui-Jung Tsai, Hsinchu (TW); Chia-Wei Wang, Hsinchu (TW); Yu-Tzu Chang, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 67 days.

(21) Appl. No.: 17/004,022

(22) Filed: Aug. 27, 2020

(65) Prior Publication Data
US 2021/0098417 A1    Apr. 1, 2021

Related U.S. Application Data

(60) Provisional application No. 62/906,732, filed on Sep. 27, 2019.

(51) Int. Cl.
| | |
|---|---|
| *H01L 21/56* | (2006.01) |
| *H01L 21/48* | (2006.01) |
| *H01L 23/00* | (2006.01) |
| *H01L 21/78* | (2006.01) |

(52) U.S. Cl.
CPC .......... *H01L 24/82* (2013.01); *H01L 21/4846* (2013.01); *H01L 21/568* (2013.01); *H01L 24/03* (2013.01); *H01L 24/11* (2013.01); *H01L 24/13* (2013.01); *H01L 24/24* (2013.01); *H01L 24/25* (2013.01); *H01L 21/78* (2013.01); *H01L 2224/02313* (2013.01); *H01L 2224/02331* (2013.01); *H01L 2224/02381* (2013.01); *H01L 2224/03462* (2013.01); *H01L 2224/03464* (2013.01); *H01L 2224/03914* (2013.01); *H01L 2224/13024* (2013.01); *H01L 2224/24011* (2013.01); *H01L 2224/24147* (2013.01); *H01L 2224/24175* (2013.01); *H01L 2224/25171* (2013.01); *H01L 2224/2939* (2013.01);
(Continued)

(58) Field of Classification Search
CPC . H01L 21/568; H01L 21/32134; H01L 24/82; H01L 24/84; H01L 2924/01001
See application file for complete search history.

(56) References Cited

U.S. PATENT DOCUMENTS

| | | |
|---|---|---|
| 8,993,380 B2 | 3/2015 | Hou et al. |
| 9,000,584 B2 | 4/2015 | Lin et al. |
| 9,048,222 B2 | 6/2015 | Hung et al. |

(Continued)

*Primary Examiner* — Dale E Page
*Assistant Examiner* — Wilner Jean Baptiste
(74) *Attorney, Agent, or Firm* — JCIPRNET

(57) ABSTRACT

Provided is a method for forming a conductive feature including forming a seed layer over a substrate; forming a patterned mask layer on the seed layer, wherein the patterned mask layer has an opening exposing the seed layer; forming a conductive material in the opening; removing the patterned mask layer to expose a portion of the seed layer; and removing the portion of the seed layer by using an etching solution including a protective agent, thereby forming a conductive feature, wherein the protective agent has multiple active sites to adsorb on the conductive material.

20 Claims, 35 Drawing Sheets

(52) U.S. Cl.
CPC ............... *H01L 2224/73209* (2013.01); *H01L 2224/82005* (2013.01); *H01L 2224/82106* (2013.01)

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,299,649 B2 | 3/2016 | Chiu et al. | |
| 9,368,460 B2 | 6/2016 | Yu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 2009/0302445 A1* | 12/2009 | Pagaila | ............... H01L 25/0657 257/E23.181 |
| 2010/0013081 A1* | 1/2010 | Toh | ....................... H01L 23/481 438/110 |
| 2016/0163578 A1* | 6/2016 | Yu | ....................... H01L 23/5384 257/738 |
| 2017/0110421 A1* | 4/2017 | Liu | ......................... H01L 25/50 |

\* cited by examiner

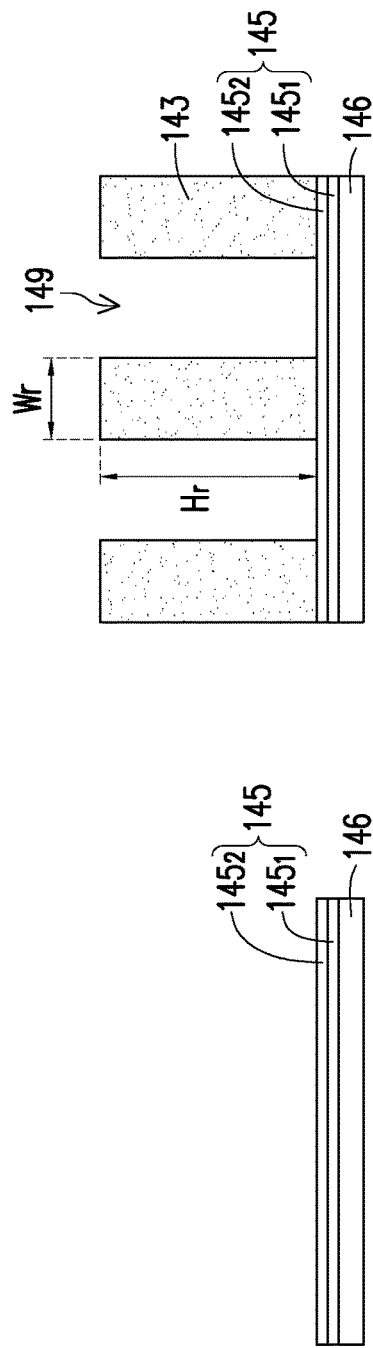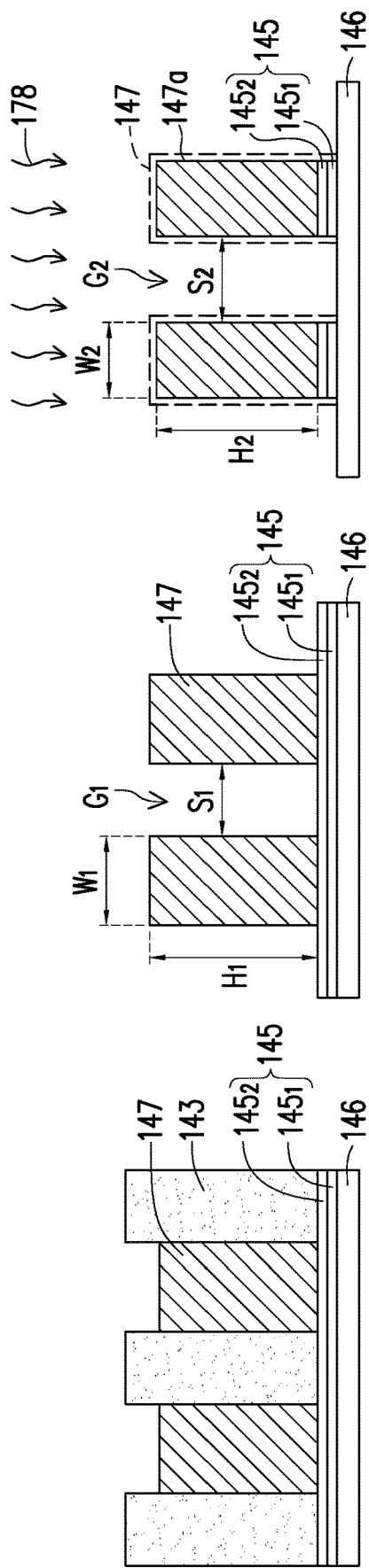

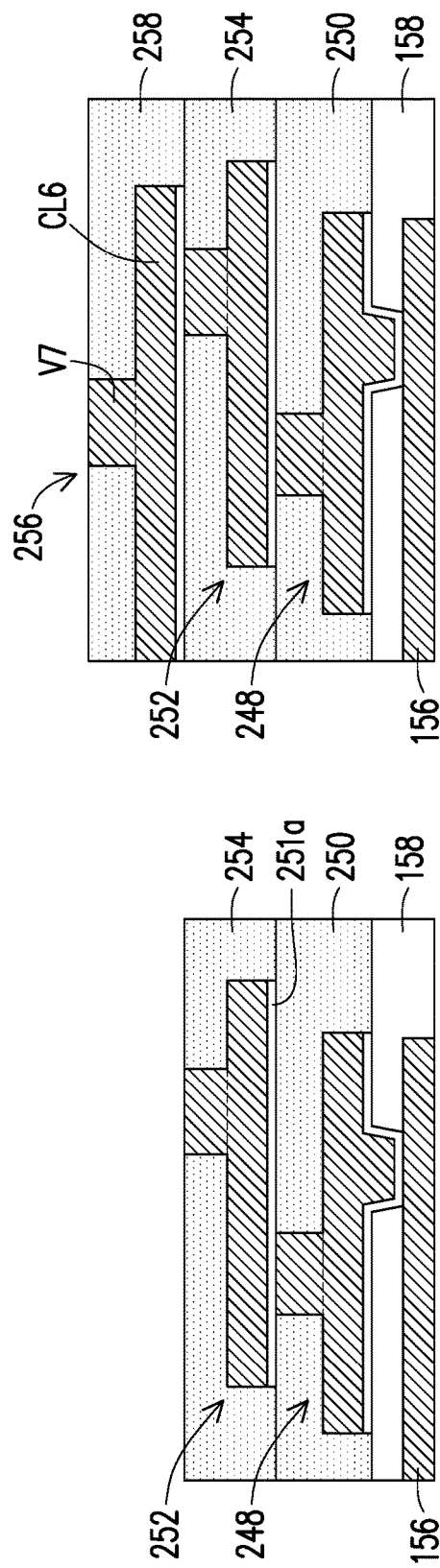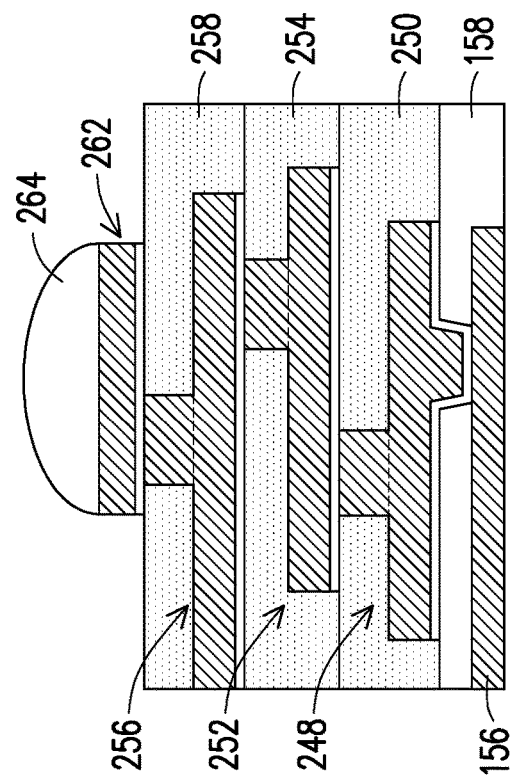
FIG. 9J
FIG. 9I
FIG. 9K

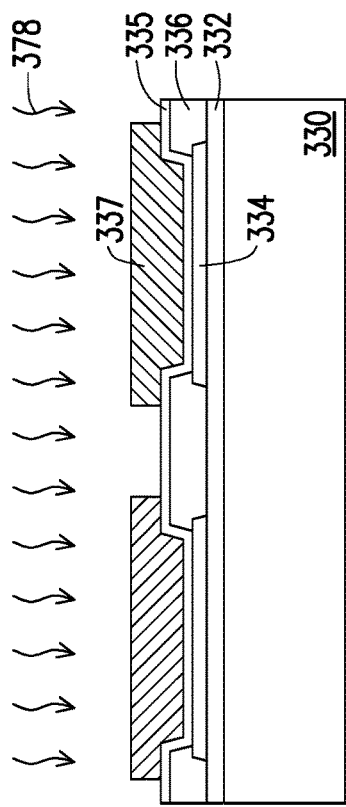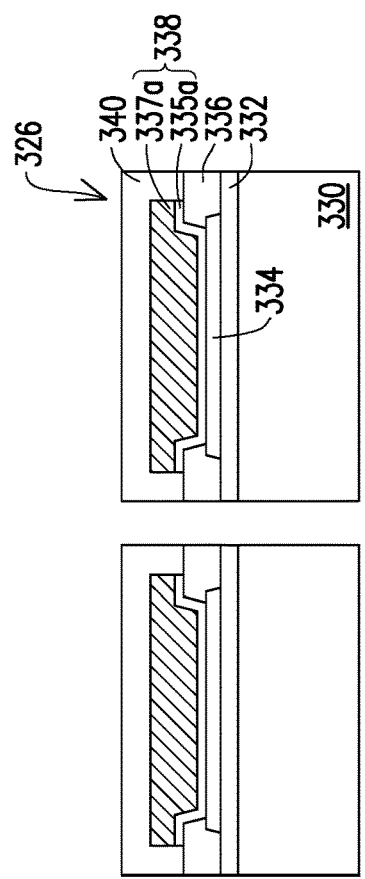
FIG. 12A  FIG. 12B
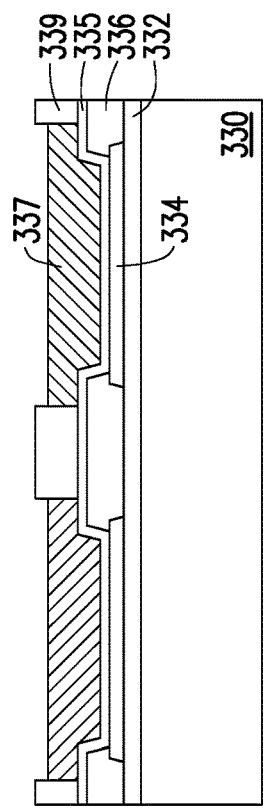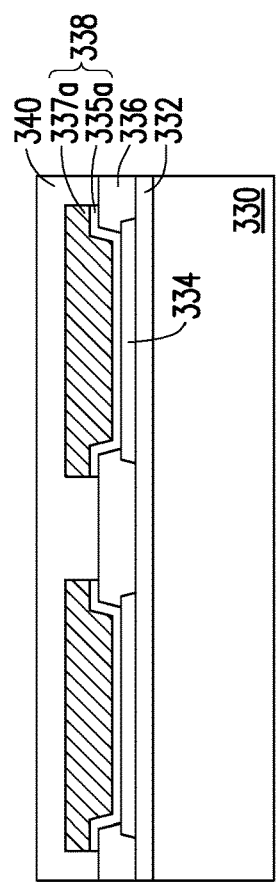
FIG. 12C  FIG. 12D

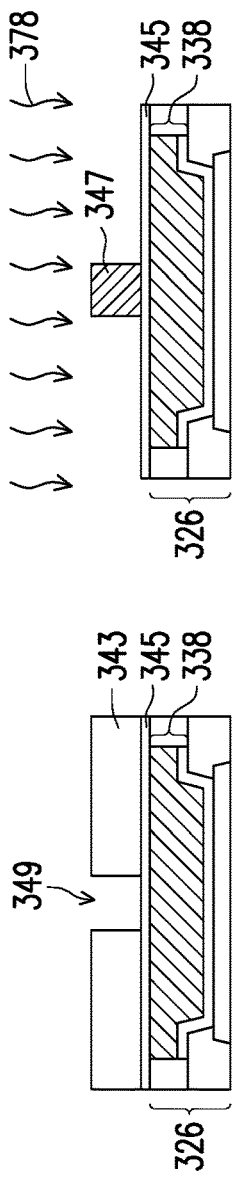
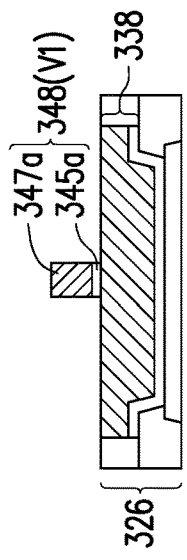
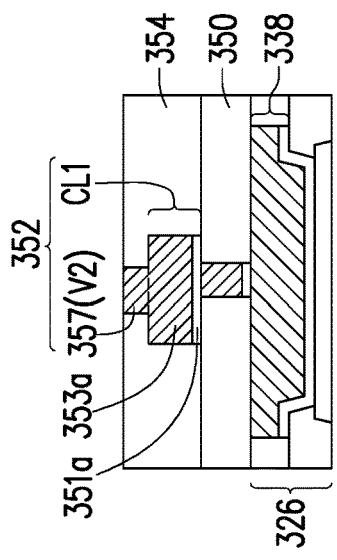
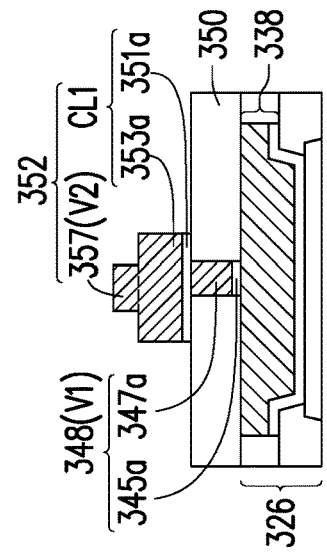
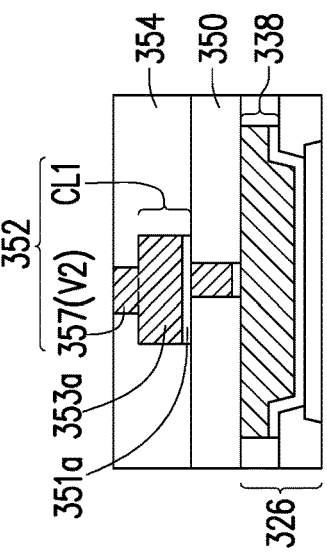
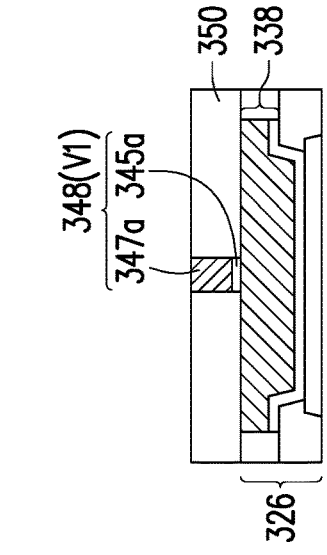

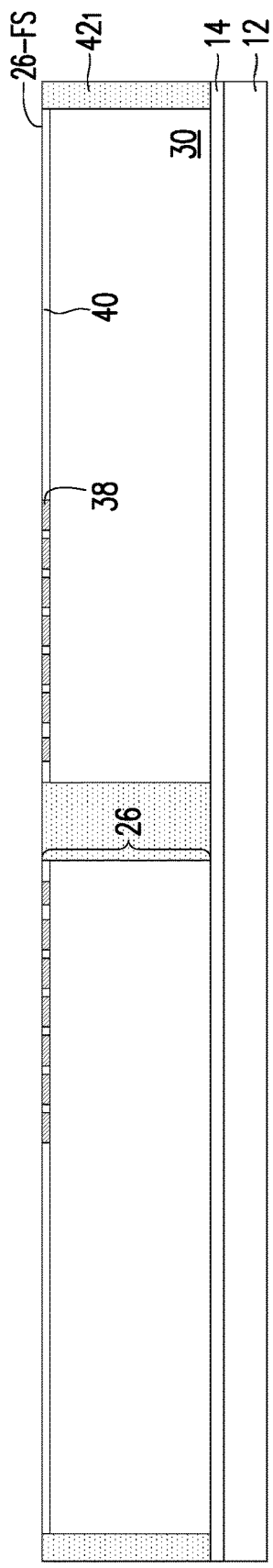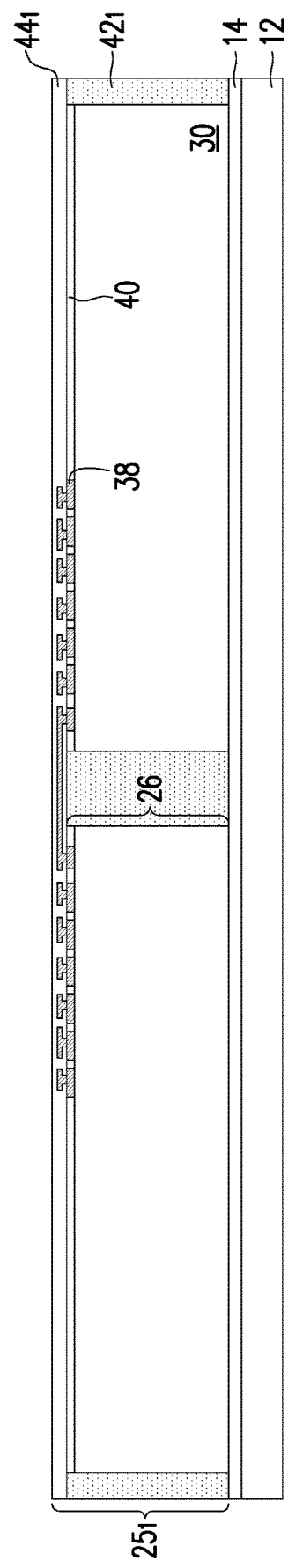
FIG. 14A
FIG. 14B

METHOD OF FABRICATING PACKAGE STRUCTURE

CROSS-REFERENCE TO RELATED APPLICATION

This application claims the priority benefit of U.S. provisional application Ser. No. 62/906,732, filed on Sep. 27, 2019. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on. The formation of the redistribution circuit structure also plays an important role during packaging process.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 4A through 4E are schematic cross-sectional views, taken along line I-I' of FIGS. 3A to 3D, illustrating a method of manufacturing metallization patterns of the front-side redistribution structure according to some embodiments of the disclosure.

FIGS. 9A through 9K are schematic cross-sectional views illustrating a method of manufacturing a front-side redistribution structure and conductive connectors according to some embodiments of the disclosure.

FIGS. 12A to 12D are schematic cross-sectional views illustrating a method of manufacturing IC dies according to some embodiments of the disclosure.

FIGS. 13A to 13I are schematic cross-sectional views illustrating a method of manufacturing a front-side redistribution structure and conductive connectors according to some embodiments of the disclosure.

FIGS. 14A through 14I are schematic cross-sectional views illustrating a method of manufacturing a device package according to some embodiments of the disclosure.

DETAILED DESCRIPTION

Figure 1A:
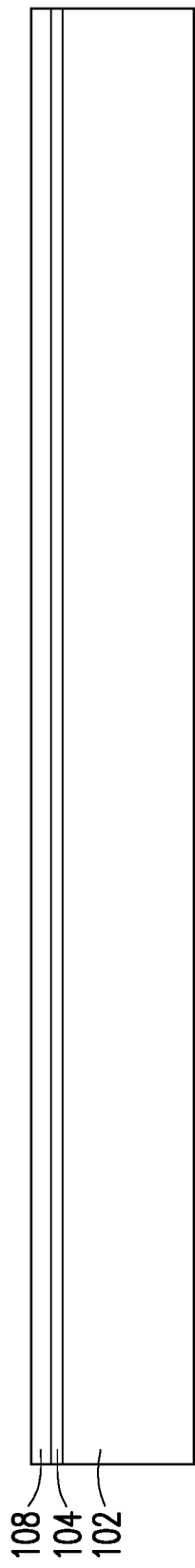
FIGS. 1A through 1F are schematic cross-sectional views illustrating a method of manufacturing a device package according to some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

The present disclosure may be used to the form conductive features, for example, through vias, metallization pattern (vias, conductive lines, or any combination thereof), pads (e.g., under bump metallurgies (UBMs)) of a front-side redistribution structure or a back-side redistribution structure, but is not limited thereto. The present disclosure may be applied to any conductive features, as long as the etching process is performed to remove the seed layer that is not covered by the formed conductive material. The etching process may be performed by using a protective agent containing a plurality of multiple active sites. The protective agent may protect surfaces and sidewalls of the conductive material, thus reducing the loss of width and height of the conductive material. Some embodiments are described below, but the disclosure is not limited thereto.

FIGS. 1A through 1F are schematic cross-sectional views illustrating a method of manufacturing a device package 100A according to some embodiments of the disclosure. The device packages 100A may also be referred to as integrated fan-out (InFO) packages.

Referring to FIG. 1A, a carrier substrate (or referred to as a substrate) 102 is provided, and a release layer 104 is formed on the carrier substrate 102. The carrier substrate 102 may be a glass carrier substrate, a ceramic carrier substrate, or the like. The carrier substrate 102 may be a wafer, such that multiple packages may be formed on the carrier substrate 102 simultaneously. The release layer 104 may be formed of a polymer-based material, which may be removed along with the carrier substrate 102 from the overlying structures that will be formed in subsequent steps. In some embodiments, the release layer 104 is an epoxy-based thermal-release material, which loses its adhesive property when heated, such as a light-to-heat-conversion (LTHC) release coating. In other embodiments, the release layer 104 may be an ultra-violet (UV) glue, which loses its adhesive property when exposed to UV lights. The release layer 104 may be dispensed as a liquid and cured, may be a laminate film laminated onto the carrier substrate 102, or may be the like. The top surface of the release layer 104 may be leveled and may have a high degree of planarity.

Referring to FIG. 1A, a bottom dielectric layer 108 is formed on the release layer 104. The bottom surface of the bottom dielectric layer 108 may be in contact with the top surface of the release layer 104. In some embodiments, the bottom dielectric layer 108 is formed of a polymer, such as polybenzoxazole (PBO), polyimide (PI), benzocyclobutene (BCB), or the like. In other embodiments, the dielectric layer 108 is formed of a nitride such as silicon nitride; an oxide such as silicon oxide, phosphosilicate glass (PSG), borosilicate glass (BSG), boron-doped phosphosilicate glass (BPSG), or the like; or the like. The bottom dielectric layer 108 may be formed by any acceptable deposition process, such as spin coating, chemical vapor deposition (CVD), laminating, the like, or a combination thereof.

Figure 1B:
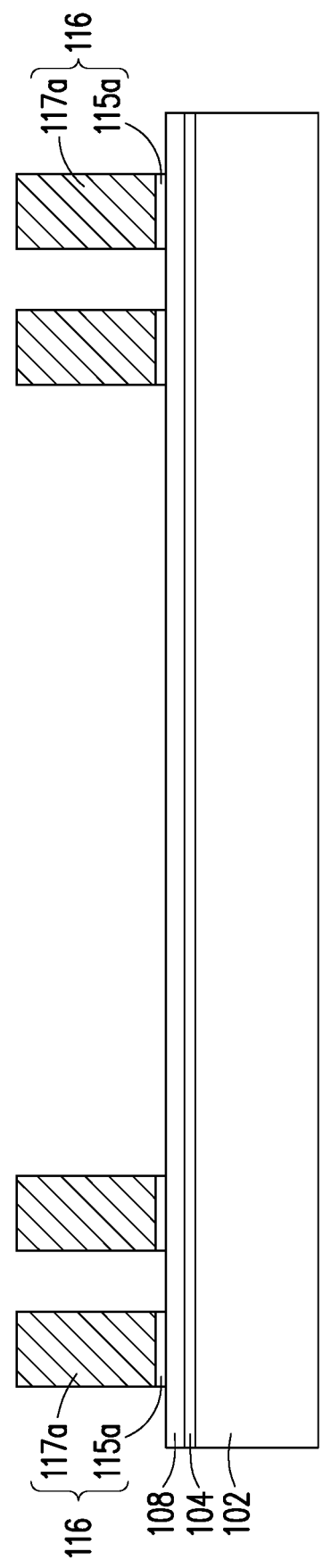
Figure 2A:
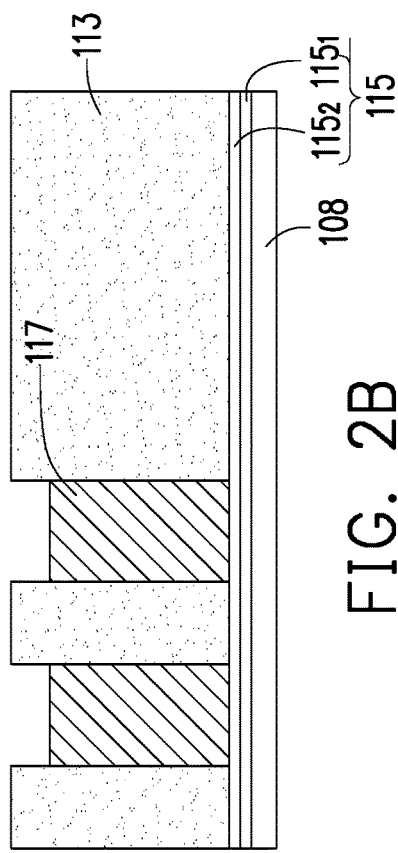
FIGS. 2A through 2D are schematic cross-sectional views illustrating a method of manufacturing conductive pillars according to some embodiments of the disclosure.
Figure 17:
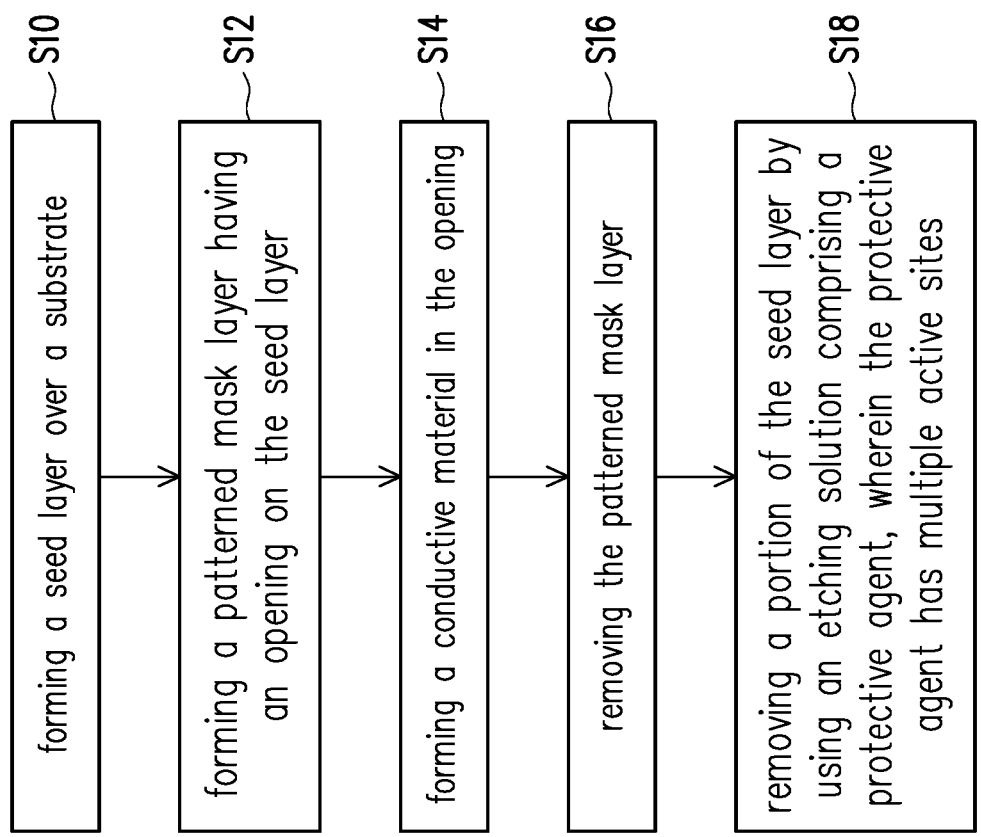
FIG. 17 illustrates a block diagram of a method for forming a conductive feature according to the disclosure.

Referring to FIG. 1B, conductive pillars (or referred to as conductive vias) 116 are formed on the bottom dielectric layer 108. Referring to FIGS. 2A and 17, as an example to form the conductive pillars 116, step S10 of FIG. 17, a seed layer 115 is formed on the bottom dielectric layer 108. In some embodiments, the seed layer 115 is a metal layer, which may be a single layer or a composite layer comprising a plurality of sub-layers formed of different materials. For example, the seed layer 115 includes a titanium layer $115_1$ and a copper layer $115_2$ over the titanium layer $115_1$. In some embodiments, the titanium layer $115_1$ has a thickness ranging from 0.01 µm to 0.5 µm, and the copper layer $115_2$ has a thickness ranging from 0.01 µm to 1 µm. The seed layer 115 may be formed by using, for example, physical vapor deposition (PVD) or the like.

Referring to FIG. 2A and step S12 of FIG. 17, a photoresist 113 is formed and patterned on the seed layer 115. The photoresist 113 may be formed by spin coating or the like and may be exposed to light for patterning. The patterning forms openings 119 through the photoresist 113 to expose the seed layer 115. After the photoresist 113 is patterned, the photoresist 113 may be referred to as a patterned mask layer.

Figure 2B:
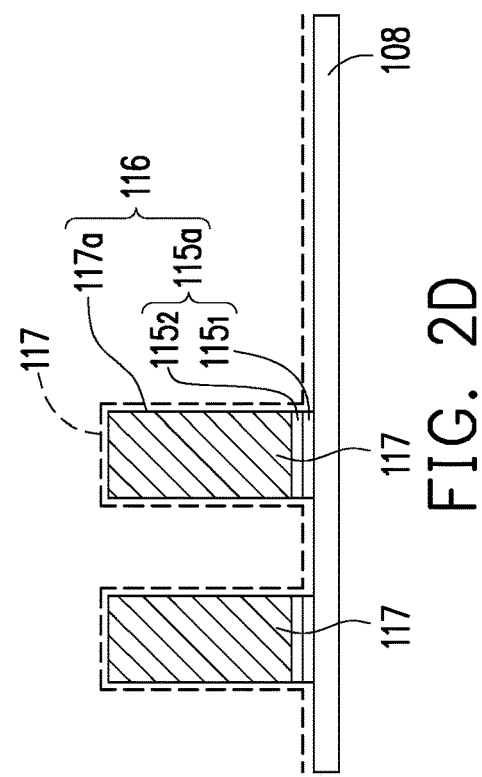

Referring to FIG. 2B and step S14 of FIG. 17, a conductive material 117 is formed in the openings 119 of the photoresist 113 and on the exposed portions of the seed layer 115. The conductive material 117 may be formed by plating, such as electroplating, electroless plating, or the like. The conductive material 117 may include a metal, such as copper, titanium, tungsten, aluminum, or the like.

Figure 2C:
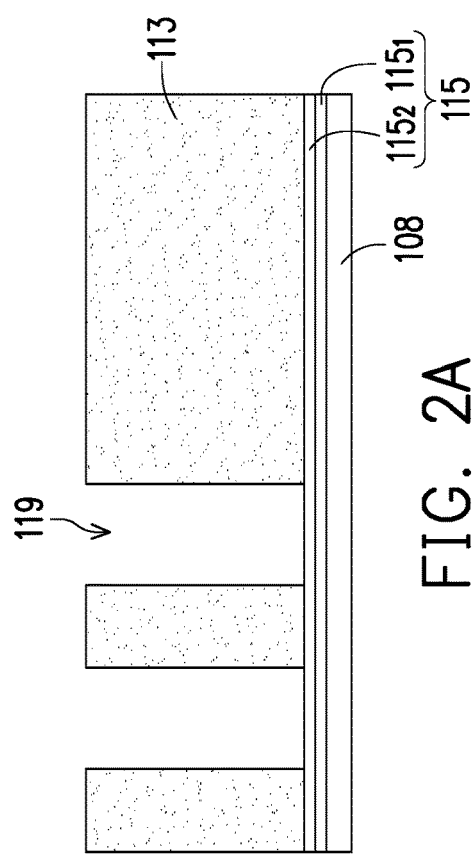

Referring to FIG. 2C and step S16 of FIG. 17, the photoresist 113 is removed to expose a portion of the seed layer 115. The photoresist 113 may be removed by an acceptable ashing or stripping process, such as using an oxygen plasma or the like, for example.

Figure 2D:
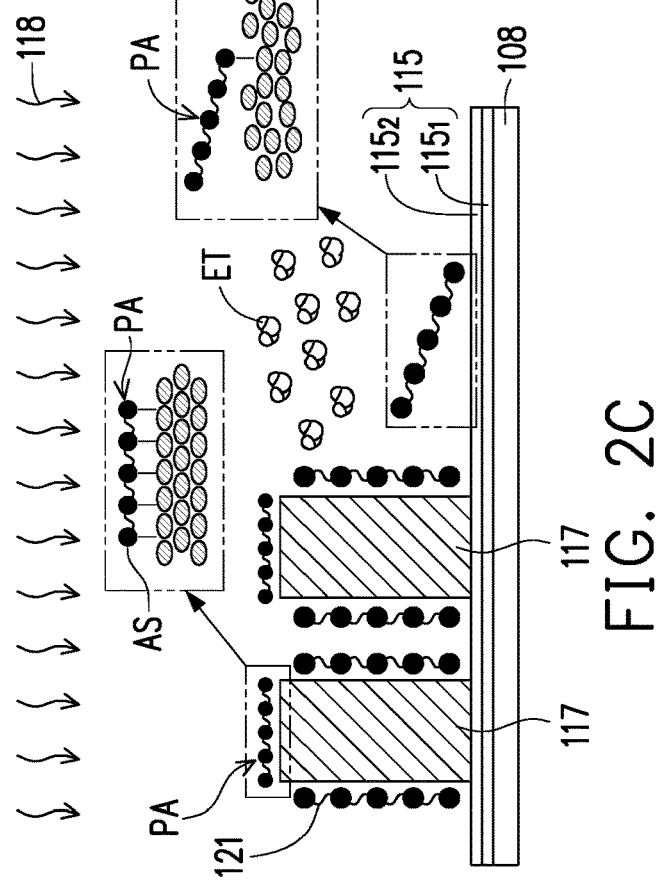

Referring to FIGS. 2C, 2D and step S18 of FIG. 17, once the photoresist 113 is removed, exposed portions of the seed layer 115 are removed by using an acceptable etching process, such as by a wet or a dry etching process. In some embodiments, the exposed portions of the seed layer 115 are removed by a wet etching process 118. The wet etching process 118 may include two etching steps. In some embodiments, a clean process may be additionally performed after the two etching steps.

An etching solution used in a first etching step of the wet etching process 118 includes solvent (not shown), etchant ET and protective agent PA. In some embodiments, the solvent includes de-ionized water (DIW). The etchant ET may include hydrogen peroxide ($H_2O_2$), phosphoric acid ($H_3PO_4$), sulfuric acid ($H_2SO_4$) or a combination thereof. In some embodiments, the etchant ET includes hydrogen peroxide, and phosphoric acid. In alternative embodiments, the etchant ET includes hydrogen peroxide, and sulfuric acid.

The protective agent PA may include an organic material. The organic material may be an organic compound or a polymer. In some embodiments, the protective agent PA includes a compound has multiple active sites. The active sites comprise nitrogen atoms, oxygen atoms, sulfur atoms, or a combination thereof. A number of the active sites in the compound is greater than 3. The compound may have a plurality of functional groups. The functional groups may include —$NH_2$, —SH, —CN, —OH, —COOH, other suitable functional groups, and/or a combination thereof.

The protective agent PA may be represented by the following formula 1.

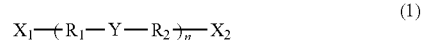

(1)

wherein
$X_1$, $X_2$ and Y comprise the active sites;
each of $X_1$ and $X_2$ independently represents —$NH_2$, —SH, —CN, —OH, —COOH;
Y represents —NH—, —$NR_3$—, —S—, —O—, or —COO—;
each of $R_1$, $R_2$ and $R_3$ independently represents a substituted or unsubstituted linear or branched alkyl group having 1 to 10 carbon atoms, a substituted or unsubstituted linear or branched alkynyl group having 2 to 10 carbon atoms, a substituted or unsubstituted linear or branched alkenyl group having 2 to 10 carbon atoms, a substituted or unsubstituted aryl group having 2 to 10 carbon atoms, a substituted or unsubstituted ester group having 2 to 10 carbon atoms, a substituted or unsubstituted ether group having 2 to 10 carbon atoms, or their derivatives; and n is an integer of 1 to 200.

In some embodiments in which the conductive material 117 includes copper, each of $X_1$, $X_2$, and Y includes a same atom such as a nitrogen atom. For example, the protective agent PA includes an amine, and the multiple active sites comprise nitrogen atoms. The amine may be represented by the following formula 2 or 3.

(2)

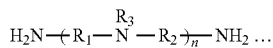
(3)

wherein each of $R_1$, $R_2$, and $R_3$ independently represents a substituted or unsubstituted linear or branched alkyl group having 1 to 10 carbon atoms, a substituted or unsubstituted linear or branched alkynyl group having 2 to 10 carbon atoms, a substituted or unsubstituted linear or branched alkenyl group having 2 to 10 carbon atoms, a substituted or unsubstituted aryl group having 2 to 10 carbon atoms, a substituted or unsubstituted ester group having 2 to 10 carbon atoms, a substituted or unsubstituted ether group having 2 to 10 carbon atoms, or their derivatives; and n is an integer of 1 to 200.

In some embodiments, the nitrogen content of the protective agent PA is in a range from 10% to 90% by weight. In alternative embodiments, the nitrogen content of the protective agent PA is in a range from 25% to 55% by weight. A ratio R of a number of nitrogen atoms to a number of carbon atoms in the protective agent PA is greater than 0.08. In some embodiments, the ratio ranges from 0.08 to 2. If the nitrogen content is less than 10% by weight or the ratio R is less than 0.08, the protective agent PA provide too few active sites to adsorb on the top surfaces and sidewalls of the conductive material. In other words, most surfaces and sidewalls of the conductive material may be exposed and etched by the etchant ET. Therefore, the loss of the width and the height of the conductive material can't be reduced. When chemicals with a nitrogen content greater than 90% or ratio R is more than 2 (for example, azane compound, and hydrazines such as triazane ($N_3H_5$) and 1,1-dimethylhydrazine) are used, the chemical hazard will become a serious issue (e.g., explosive, flammable, and health hazard) and thus not suitable for a protective agent).

The protective agent PA includes polyamine. The polyamine may be a secondary polyamine, a tertiary polyamine, or a combination thereof. Compared with primary poly amine, secondary polyamine and tertiary polyamine may provide more active sides. For example, the secondary polyamine includes diethylenetriamine (formula 4) and tetraethylenepentamine (formula 5), and the tertiary polyamine includes tris(2-aminoethyl) amine (formula 6).

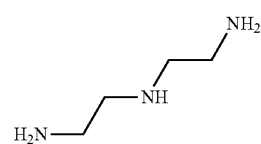
(4)

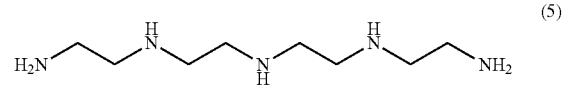
(5)

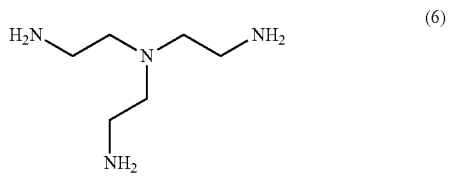
(6)

In some embodiments, the protective agent PA has a molecular number-average weight ranging from 75 g/mol to 10000 g/mol. The concentration of the protective agent PA may be designed according to the compositions of the etching solution. In some embodiments, the concentration of the protective agent PA in the etching solution may be adjusted according to the concentration of the etchant ET (e.g., hydrogen peroxide and phosphoric acid, or hydrogen peroxide and sulfuric acid) in the etching solution. In an example, the etching solution includes hydrogen peroxide having the concentration ranging from 0.1% to 30% by weight, and phosphoric acid or sulfuric acid has the concentration ranging from 0.5% to 40% by weight, and the protective agent PA having a concentration ranging from 1 ppm to 20000 ppm. It is noted that the concentration and the molecular weight of the protective agent PA discussed above are exemplary only, and not intended to be limiting beyond what is specifically recited in the claims that follow. It will be understood by those skilled in the art that various combination of concentration and molecular weight of the protective agent PA may be used in the etching solution. In an embodiment, the etching solution may include a protective agent PA of a lower concentration and a smaller molecular weight. In another embodiment, the etching solution may include a protective agent PA of a higher concentration and a larger molecular weight.

The wet etching process 118 may be a spray etching or an immersion etching. In some embodiments, the wet etching process 118 is performed at a temperature of 5 degree Celsius to 50 degree Celsius, a spin speed of 50 rpm to 3000 rpm, a flow rate of 20 ml/min to 3000 ml/min, and a process period of 0.05 min to 10 min.

Referring to FIG. 2C, the active sites AS of the protective agent PA may interact with the metal atoms of the conductive material 117 and the seed layer 115. However, since the conductive material 117 and the seed layer 115 are formed in different methods, the conductive material 117 and the seed layer 115 may have different structure. Therefore, the protective agent PA has different adsorption properties between the conductive material 117 and the seed layer 115. In some embodiments, the conductive material 117 is formed by electro-chemical-plating (ECP), thus having high crystallinity and order stacking, and the seed layer 115 is formed by sputtering, thus having poor crystallinity and random stacking. In some embodiments, the protective agent PA tends to be adsorbed on the surface of the conductive material 117 rather than the surface of the seed layer 115.

Since the protective agent PA has multiple active sites AS, which may simultaneously interact with multiple metal atoms on the surface of the conductive material 117, the conductive material 117 has better adsorption efficiency of the protective agent PA. The protective agent PA adsorbed on the conductive material 117 may form a protection layer 121 on the surface and the sidewalls of the conductive material 117. On the other hand, the protective agent PA adsorbed on the seed layer 115 is relatively less than the protective agent PA adsorbed on the conductive material 117. Therefore, it is unlikely to form a protection layer on the surface of the seed layer 115.

During the first etching step of the wet etching process 118, the protection layer 121 may protect the conductive material 117 from the contact and/or the interaction between the etchant ET and the conductive material 117. As a result, the etching rate of the conductive material 117 is reduced. On the other hand, since there is no protection layer on the surface of the seed layer 115 or a thin and discontinuous protective layer on the surface of the seed layer 115, the etchant ET may directly contact and/or interact with the seed layer 115. As a result, the etching rate of the seed layer 115 is higher than the etching rate of the conductive material 117. In other words, by adding the protective agent PA, the etching solution may have better etching selectivity between the seed layer 115 and the conductive material 117. In some embodiments, a ratio of an etch rate of the seed layer 115 to an etch rate of the conductive material 117 ranges from 1 to 10.

By adding the protective agent PA into the etching solution used in the first etching step, the etching rate of the conductive material 117 may be reduced. Therefore, after a main etching process is finished, there may be enough time to perform an over etching process, and thus, the etch uniformity may be improved. In some embodiments, the thickness of the seed layer 115 is about 20 nm to about 1000 nm, the etching rate is about 2 nm/sec to about 500 nm/sec. In some embodiments, a period of the main etching process ranges from 0.1 min to 10 min, and a period of the over etching process ranges from 1% to 2000% of the period of the main etching process. In some embodiments, after the wet etching process 118 is performed, the conductive material 117a has a non-uniformity of 7.8% or less. Herein, the non-uniformity is defined by 3*sigma/mean value of critical dimension of the conductive material (i.e., RDL) 117a after the etching process of the seed layer. In other words, the uniformity of the conductive material 117a may be improved.

Referring to FIG. 2D, during the first etching step of the wet etching process, the exposed portions of the copper layer $115_2$ are removed, and the conductive material 117 is partially removed. In some embodiments, after the copper layer $115_2$ are removed, surfaces of the conductive material 117 and the titanium layer $115_1$ are cleaned by deionized water. Thereafter, a second etching step of the wet etching process is performed on the titanium layer $115_1$ by using an etching solution. In some embodiments, the etching solution may include hydrofluoric acid solution, or a mixture of hydrogen peroxide and sodium hydroxide. After the titanium layer $115_1$ is removed, a portion of the seed layer 115a and a portion of the conductive material 117a are left. The seed layer 115a and the conductive material 117a together form the conductive pillars 116. In some embodiments, after the conductive pillars 116 are formed, surfaces of the formed conductive pillars 116 and the bottom dielectric layer 108 are cleaned by deionized water further processing.

During the first etching step of the wet etching process, the protective agent may protect the surface of the conductive material, the loss of the width and the height of the conductive material 117 may be reduced, and the damage of the conductive material 117 may also be reduced. Therefore, the top surface roughness and the sidewall surface roughness of the conductive material 117a may be reduced. In some embodiments, the top surface roughness and the sidewall surface roughness Ra of the conductive material 117a is less than 50 nm. The improvement of the top surface and sidewall surface roughness Ra of the conductive material 117a may provide better impedance control and lower signal loss, especially for high frequency signal transmission applications.

Referring back to FIG. 1C, integrated circuit (IC) dies 126 and 127 are adhered to the release layer 104 by an adhesive 128. The IC dies 126 and 127 are attached laterally aside the conductive pillars 116. The IC dies 126 and 127 may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the IC dies 126 and 127 may be in different sizes (e.g., different heights and/or surface areas). In alternative embodiments, the IC dies 126 and 127 may be in the same size (e.g., same heights and/or surface areas).

Figure 1C:
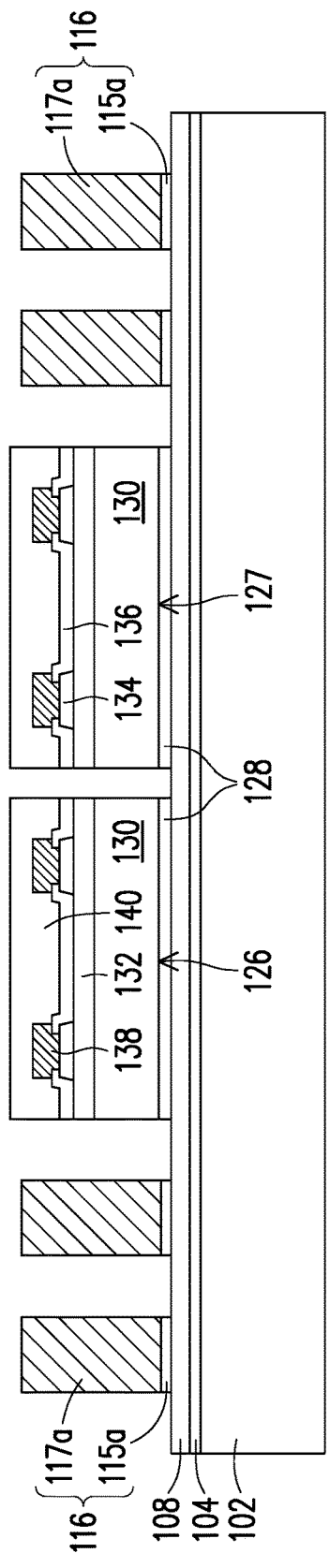

Referring to FIG. 1C, before being adhered to the bottom dielectric layer 108, the IC dies 126 and 127 may be processed according to applicable manufacturing processes to form integrated circuits in the IC dies 126 and 127. For example, the IC dies 126 and 127 may each include a semiconductor substrate 130, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices, such as transistors, diodes, capacitors, resistors, etc., may be formed in and/or on the semiconductor substrate 130 and may be interconnected by interconnect structures 132 formed by, for example, metallization patterns in one or more dielectric layers on the semiconductor substrate 130 to form an integrated circuit.

The IC dies 126 and 127 further include pads 134, such as aluminum pads, to which external connections are made. The pads 134 are on what may be referred to as respective active sides of the IC dies 126 and 127. Passivation films 136 are formed on the interconnect structures 132 and on portions of the pads 134. Openings extend through the passivation films 136 to the pads 134. Die connectors 138, such as conductive pillars (for example, comprising a metal such as copper), extend through the openings in the passivation films 136 and are mechanically and electrically coupled to the corresponding pads 134. The die connectors 138 may be formed by, for example, plating, or the like. The die connectors 138 electrically couple the corresponding integrated circuits of the IC dies 126 and 127.

A dielectric material 140 is on the active sides of the IC dies 126 and 127, such as on the passivation films 136 and the die connectors 138. The dielectric material 140 laterally encapsulates the die connectors 138, and the dielectric material 140 is laterally coterminous with the respective IC dies 126 and 127. The dielectric material 140 may be a polymer such as PBO, polyimide, BCB, or the like; a nitride such as silicon nitride or the like; an oxide such as silicon oxide, PSG, BSG, BPSG, or the like; the like, or a combination thereof, and may be formed, for example, by spin coating, lamination, CVD, or the like.

The adhesive 128 is on back-side surfaces of the IC dies 126 and 127 and adheres the IC dies 126 and 127 to the bottom dielectric layer 108. In some embodiments, the first surfaces may be referred to as first surfaces or non-active surfaces. The back-side surfaces are opposite to front-side surfaces, the first surfaces are opposite to second surfaces, and the non-active surfaces are opposite to active side surfaces. The adhesive 128 may be applied to the back-side surfaces of the IC dies 126 and 127 before singulating to separate the IC dies 126 and 127. The adhesive 128 may be any suitable adhesive, epoxy, die attach film (DAF), or the like.

Figure 1D:
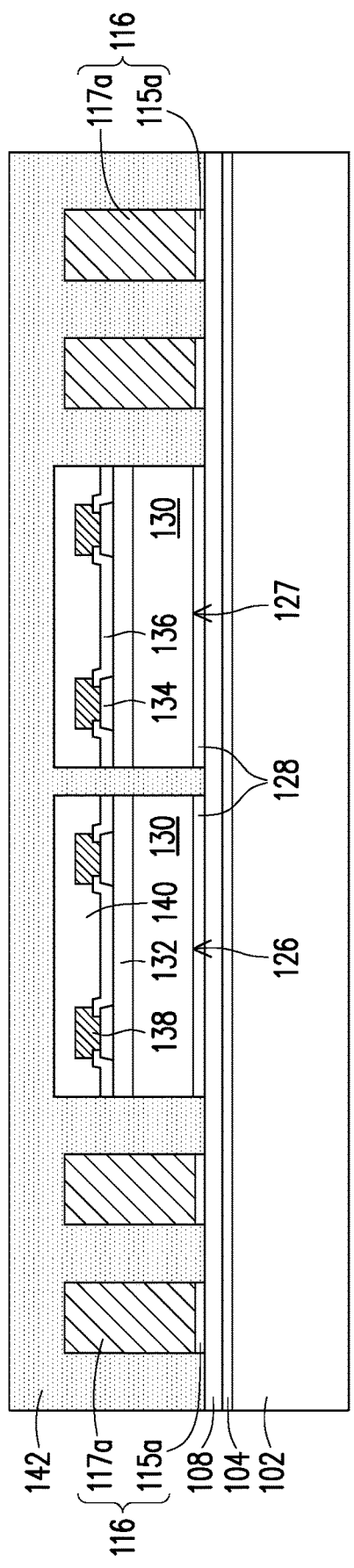

Referring to FIG. 1D, an encapsulant 142 is formed on the various components. After formation, the encapsulant 142 laterally encapsulates the conductive pillars 116 and IC dies 126 and 127. In some embodiments, the encapsulant 142 includes a molding compound, a molding underfill, a resin such as epoxy, a combination thereof, or the like. In some other embodiments, the encapsulant 142 includes a photosensitive material such as polybenzoxazole (PBO), polyimide (PI), benzocyclobutene (BCB), a combination thereof, or the like, which may be easily patterned by exposure and development processes or laser drilling process. In alternative embodiments, the encapsulant 142 includes nitride such as silicon nitride, oxide such as silicon oxide, phosphosilicate glass (PSG), borosilicate glass (BSG), boron-doped phosphosilicate glass (BPSG), a combination thereof, or the like.

In some embodiments, the encapsulant 142 includes a composite material including a base material (such as polymer) and a plurality of fillers in the base material. The filler may be a single element, a compound such as nitride, oxide, or a combination thereof. The fillers may include silicon oxide, aluminum oxide, boron nitride, alumina, silica, or the like, for example. The cross-section shape of the filler may be circle, oval, or any other shape. In some embodiments, the fillers are spherical particles, or the like. In some embodiments, the fillers include solid fillers, but the disclosure is not limited thereto. In some embodiments, a small portion of the fillers may be hollow fillers.

The filler size and filler content of the encapsulant 142 are controlled in a suitable range, and suitable base material and additives are selected to form the encapsulant 142, such that the encapsulant 142 has a good property to provide the encapsulation of the IC dies 126 and 127. For example, the average filler size of the filler may be less than 30 μm. In some embodiments, the content of the fillers in the encapsulant 142 is greater than 70 wt %, such as 70 wt % to 90 wt % or more, based on the total weight of the encapsulant 142.

The encapsulant 142 may be applied by compression molding, transfer molding, spin-coating, lamination, deposition, or similar processes, and may be formed over the carrier substrate 102 such that the conductive pillars 116 and/or the IC dies 126 are buried or covered. The encapsulant 142 is then cured.

Figure 1E:
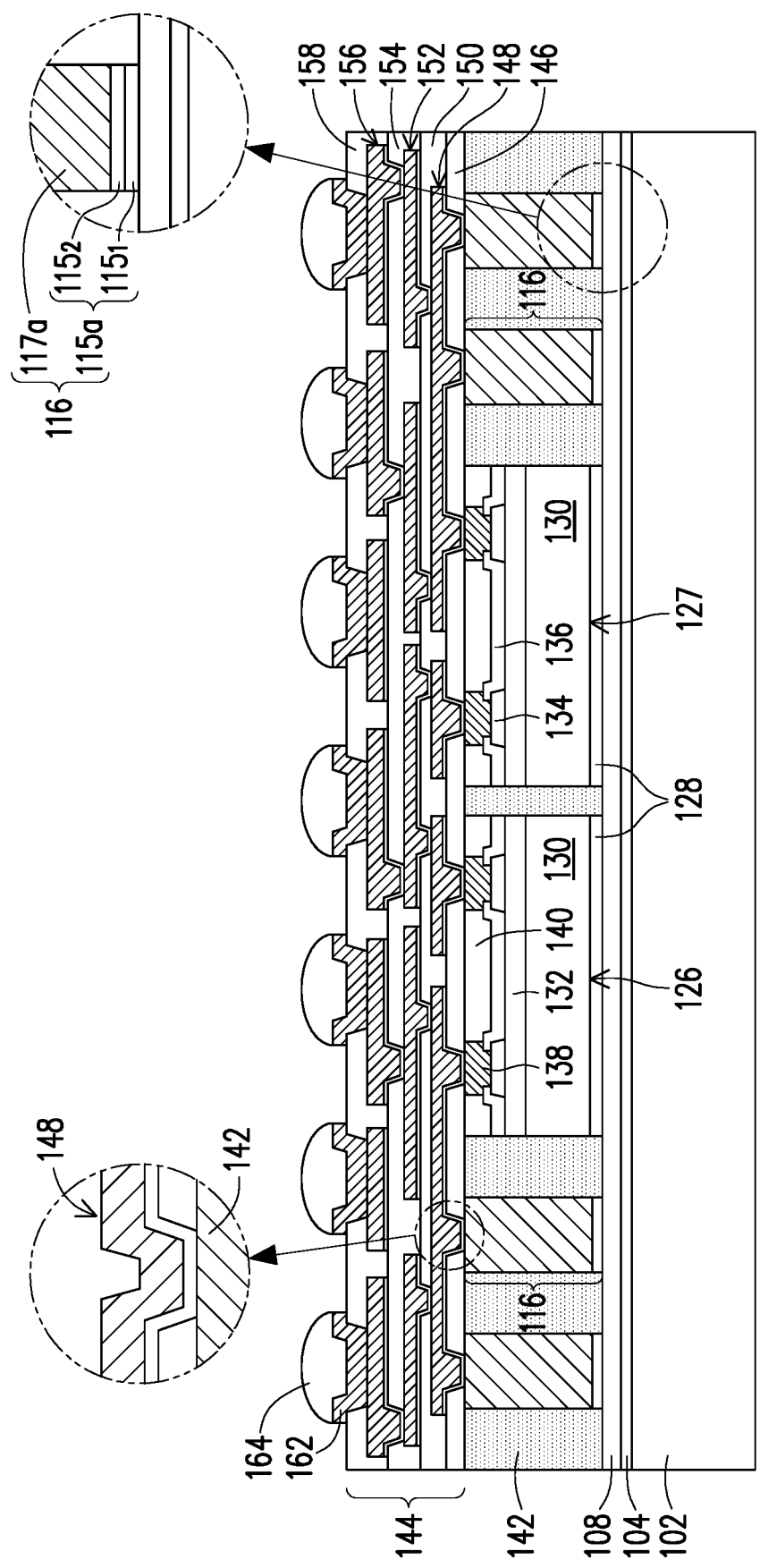

Referring to FIG. 1E, a planarization process is then performed on the encapsulant 142 to remove a portion of the encapsulant 142, such that the top surfaces of the conductive pillars 116 and the die connectors 138 are exposed. In some embodiments which the top surfaces of the conductive pillars 116 and the front-side surfaces of the IC dies 126 are not coplanar (as shown in FIG. 1C), portions of the conductive pillars 116 or/and portions of the dielectric material 140 may also be removed by the planarization process. In some embodiments, top surfaces of the conductive pillars 116, the die connectors 138, the dielectric material 140, and the encapsulant 142 are substantially coplanar after the planarization process. The planarization process may be, for example, a chemical-mechanical polish (CMP), a grinding process, or the like. In some embodiments, the planarization may be omitted, for example, if the conductive pillars 116 and die connectors 138 are already exposed. The conductive pillars 116 penetrate the encapsulant 142, and the conductive pillars 116 are sometimes referred to as through vias 116 or through integrated fan-out vias (TIVs) 116.

Referring to FIG. 1E, a front-side redistribution structure 144 is formed over front-side surfaces of the IC dies 126, the through vias 116, and the encapsulant 142. The front-side redistribution structure 144 includes dielectric layers 146, 150, 154, and 158; metallization patterns 148, 152, and 156; and under bump metallurgies (UBMs) 162. The metallization patterns may also be referred to as redistribution layers or redistribution lines. The front-side redistribution structure 144 is shown as an example. More or fewer dielectric layers and metallization patterns may be formed in the front-side redistribution structure 144. If fewer dielectric layers and metallization patterns are to be formed, steps and process discussed below may be omitted. If more dielectric layers and metallization patterns are to be formed, steps and processes discussed below may be repeated.

FIGS. 3A to 3F are schematic cross-sectional views illustrating a method of manufacturing a front-side redistribution structure 144 and conductive connectors 164 according to some embodiments of the disclosure. FIGS. 4A through 4E are schematic cross-sectional views, taken along line I-I' of FIGS. 3A to 3D, illustrating a method of manufacturing metallization patterns 148 of the front-side redistribution structure 144 according to some embodiments of the disclosure.

Figure 3A:
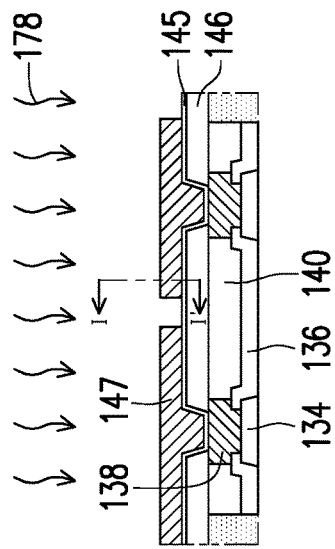
FIGS. 3A to 3F are schematic cross-sectional views illustrating a method of manufacturing a front-side redistribution structure and conductive connectors according to some embodiments of the disclosure.

Referring to FIGS. 1E, 3A and 4A, as an example to form the front-side redistribution structure 144, the dielectric layer 146 is deposited on the encapsulant 142, the through vias 116, and the die connectors 138. In some embodiments, the dielectric layer 146 is formed of a photo-sensitive material such as PBO, polyimide, BCB, or the like, which may be patterned using a lithography mask. The dielectric layer 146 may be formed by spin coating, lamination, CVD, the like, or a combination thereof. The dielectric layer 146 is then patterned. The patterning forms via openings (not shown) exposing portions of the through vias 116 and the die connectors 138. The patterning may be by an acceptable process, such as by exposing the dielectric layer 146 to light when the dielectric layer 146 is a photo-sensitive material or by etching using, for example, an anisotropic etch. If the dielectric layer 146 is a photo-sensitive material, the dielectric layer 146 may be developed after the exposure.

Referring to FIGS. 3A, 4A and step S10 of FIG. 17, a seed layer 145 is formed over the dielectric layer 146 and in the via openings extending through the dielectric layer 146. In some embodiments, the seed layer 145 is a metal layer, which may be a single layer or a composite layer comprising a plurality of sub-layers formed of different materials. In some embodiments, the seed layer 145 includes a titanium layer 145₁ and a copper layer 145₂ over the titanium layer 145₁ as shown in FIG. 4A. The seed layer 145 may be formed using, for example, PVD or the like.

Figure 3B:
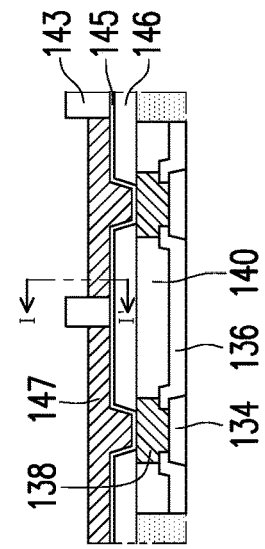

Referring to FIGS. 3B, 4B and step S12 of FIG. 17, a photoresist 143 is then formed and patterned on the seed layer 145. The photoresist 143 may be formed by spin coating or the like and may be exposed to light for patterning. The pattern of the photoresist 143 corresponds to the metallization pattern 148 to be formed. The patterning forms trench openings 149 through the photoresist 143 to expose the seed layer 145. After the photoresist 143 is patterned, the photoresist 143 may be referred to as a patterned mask layer.

Referring to FIGS. 3B, 4C and step S14 of FIG. 17, a conductive material (or referred to as a patterned conductive layer) 147 is then formed in the trench openings 149 of the photoresist 143 and on the exposed portions of the seed layer 145. The conductive material 147 may be formed by plating, such as electroplating or electroless plating, or the like. The conductive material 147 may include a metal, like copper, titanium, tungsten, aluminum, or the like.

Figure 3C:
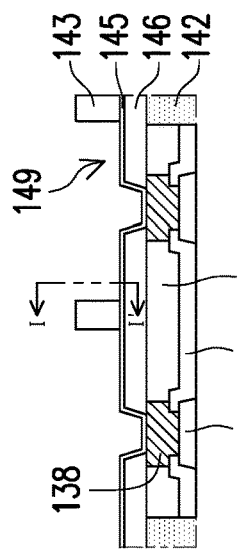

Referring to FIGS. 3C, and 4D, and step S16 of FIG. 17, the photoresist 143 is removed. The photoresist 143 may be removed by an acceptable ashing or stripping process, such as using an oxygen plasma or the like.

Figure 3D:
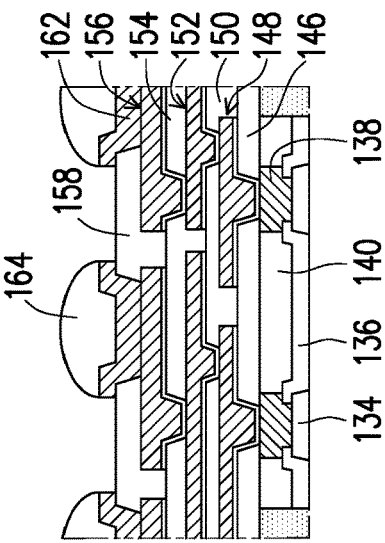

Referring to FIGS. 3D, and 4E, and step S18 of FIG. 17, once the photoresist 143 is removed, exposed portions of the seed layer 145 are removed, such as by using an acceptable etching process, such as by a wet or a dry etching process. In some embodiments, a wet etching process 178 is performed to remove the exposed portions of the seed layer 145. The wet etching process 178 may be performed in a manner the same as or similar to the wet etching process 118 as illustrated in FIG. 2C.

After the wet etching process, a seed layer 145a and a conductive material 147a are left, and the seed layer 145a and the conductive material 147a form the metallization pattern 148.

Referring to FIGS. 4D and 4E, in some embodiments, since the protective agent PA is added to the etching solution, the loss of the width and the height of the conductive material 147 may be reduced. In some embodiments, the width $W_1$ of the conductive material 147 is about 0.42 μm, and the width $W_2$ of the conductive material 147a is about 0.4 μm. The ratio of the width $W_2$ of the conductive material 147a to the width $W_1$ of the conductive material 147 is between 66.7% to 97.6%. In other words, the loss of the width $W_1$ of the conductive material 147, $\Delta W$ %, is about 2.4% to 33.3%, wherein $\Delta W\ \% = (W_1 - W_2) \times 100 / W_1$. Under the condition that the width $S_2$ of the gap $G_2$ between the conductive materials 147a is kept the same, when the loss of the width $W_1$ of the conductive material 147, $\Delta W$ %, is larger, the width $S_1$ of the gap $G_1$ between the conductive materials 147 needs to be designed with a smaller width, which corresponds to a smaller width $W_r$ of the photoresist 143. Contrarily, when the loss of the width $W_1$ of the conductive material 147, $\Delta W$ %, is smaller, the width $S_1$ of the gap $G_1$ between the conductive materials 147 may to be designed with a larger width. Therefore, the photoresist 143 with a larger width $W_r$ may be used. In some embodiments of the present disclose, since the loss of the width $W_1$ of the conductive material 147, $\Delta W$ %, is smaller, the photoresist 143 with larger width $W_r$ may be used. In some embodiments, the width $W_r$ of the photoresist 143 is about 0.4 μm, and a height $H_r$ of the photoresist 143 is about 1.0 μm. An aspect ratio of the photoresist 143 is less than 5, for example 2.5. Since the aspect ratio of the photoresist 143 is reduced, it may avoid the collapse of the photoresist 143 due to a larger aspect ratio. Therefore, the patterning window may be expanded, and photoresist profile and critical dimension uniformity would be improved. Therefore, better performance of the device may be obtained.

In some embodiments, a height $H_1$ of the conductive material 147 is about 0.82 μm, and a height $H_2$ of the conductive material 147a is about 0.8 μm. The ratio of the height $H_2$ of the conductive material 147a to the height $H_1$ of the conductive material 147 is between 80% and 98.8%. In other words, the loss of the height $H_1$ of the conductive material 147, $\Delta H$ %, is about 1.2% to 20%, wherein $\Delta H\ \% = (H_1 - H_2) \times 100 / H_1$. Since the loss of the height $H_1$ of the conductive material 147, $\Delta H$ %, is small, the conductive material 147 with the desired height $H_1$ may be formed. As a result, the production cost is reduced. By using the etching solution containing the protective agent, the loss of the width of the conductive material 147 is smaller, the photoresist 143 with larger width may be used.

Referring to FIGS. 1E and 3D, the metallization pattern 148 includes conductive lines CL1 on and extending along the top surface of the dielectric layer 146. The metallization pattern 148 further includes conductive vias V1 extending through the dielectric layer 146 to be physically and electrically connect to the through vias 116 and the IC dies 126. The sidewalls of the conductive vias V1 and the conductive lines CL1 may be straight or inclined. In some embodiments, the conductive via V1 has inclined sidewall and is tapered toward the IC dies 126. In addition, the metallization pattern 148 may be a conformal layer, and has a recess on the conductive via V1.

Figure 3E:
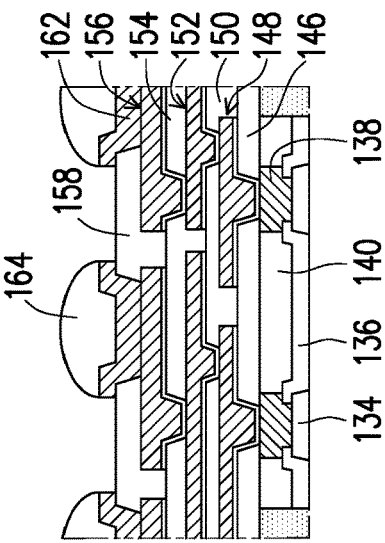

Referring to FIGS. 1E and 3E, after the metallization pattern 148 is formed, the dielectric layers 150, 154, 158, and the metallization patterns 152, 156 are formed alternately. The dielectric layer 150, 154, and 158 may be formed in a manner similar to the dielectric layer 146, and may be formed of the same material as the dielectric layer 146. The metallization patterns 152 and 156 may include conductive lines CL2 and CL3 on the underlying dielectric layer and conductive vias V2 and V3 extending through the underlying dielectric layer respectively. The metallization patterns 152 and 156 may be formed in a manner similar to the metallization pattern 148, and may be formed of the same material as the metallization pattern 148. The UBMs 162 are optionally formed on and extending through the dielectric layer 158. The UBMs 162 may be formed in a manner similar to the metallization pattern 148, and may be formed of the same material as the metallization pattern 148.

Figure 3F:
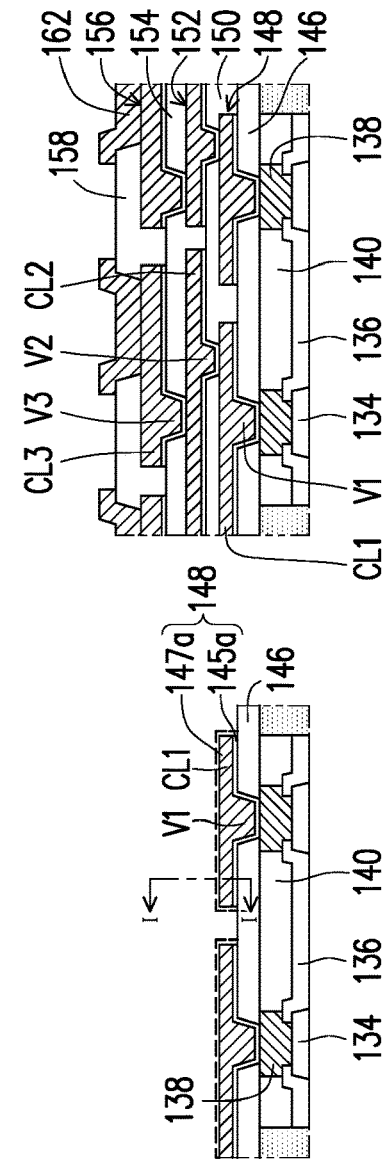
Figure 5A:
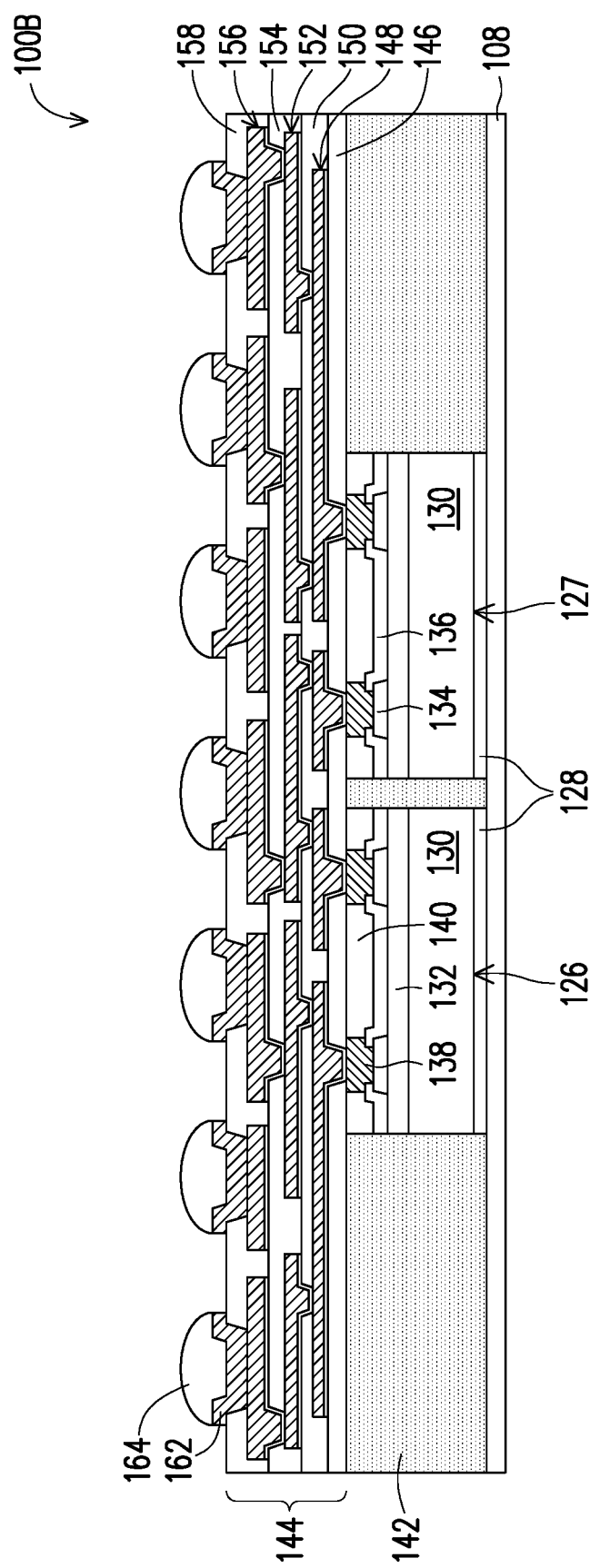
FIGS. 5A to 5D are schematic cross-sectional views illustrating device packages according to some embodiments of the disclosure.
Figure 5B:
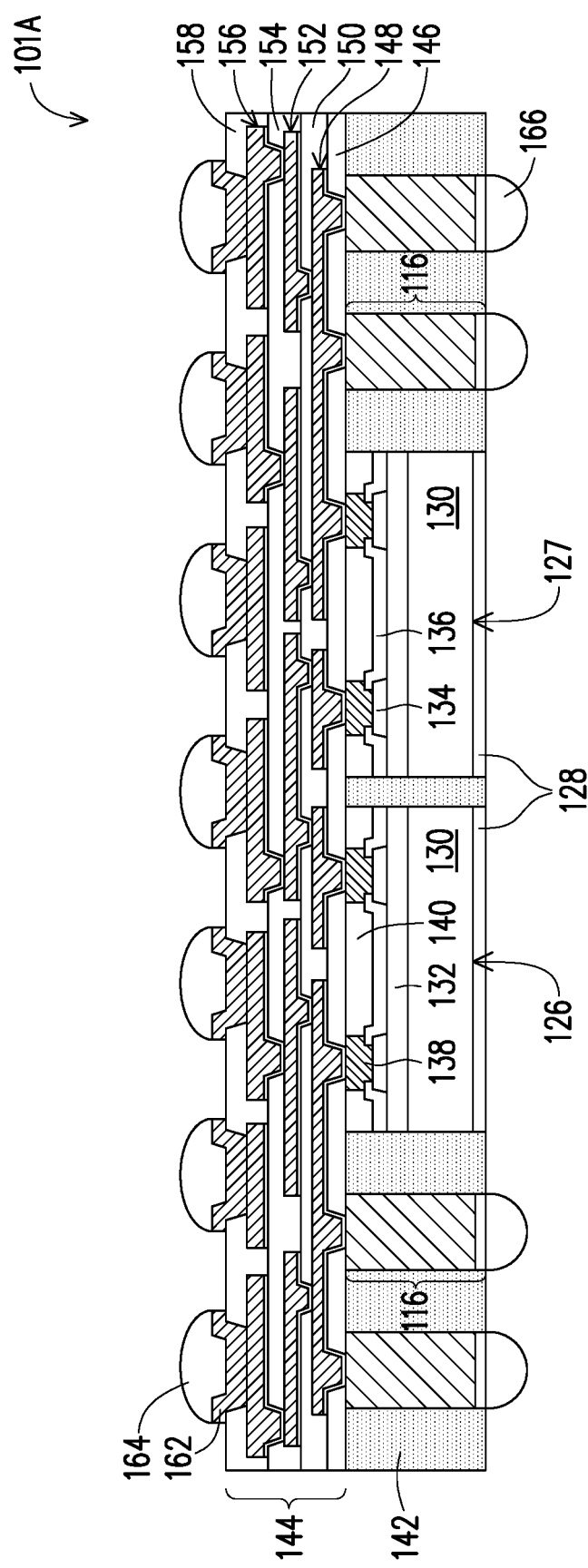
Figure 5C:
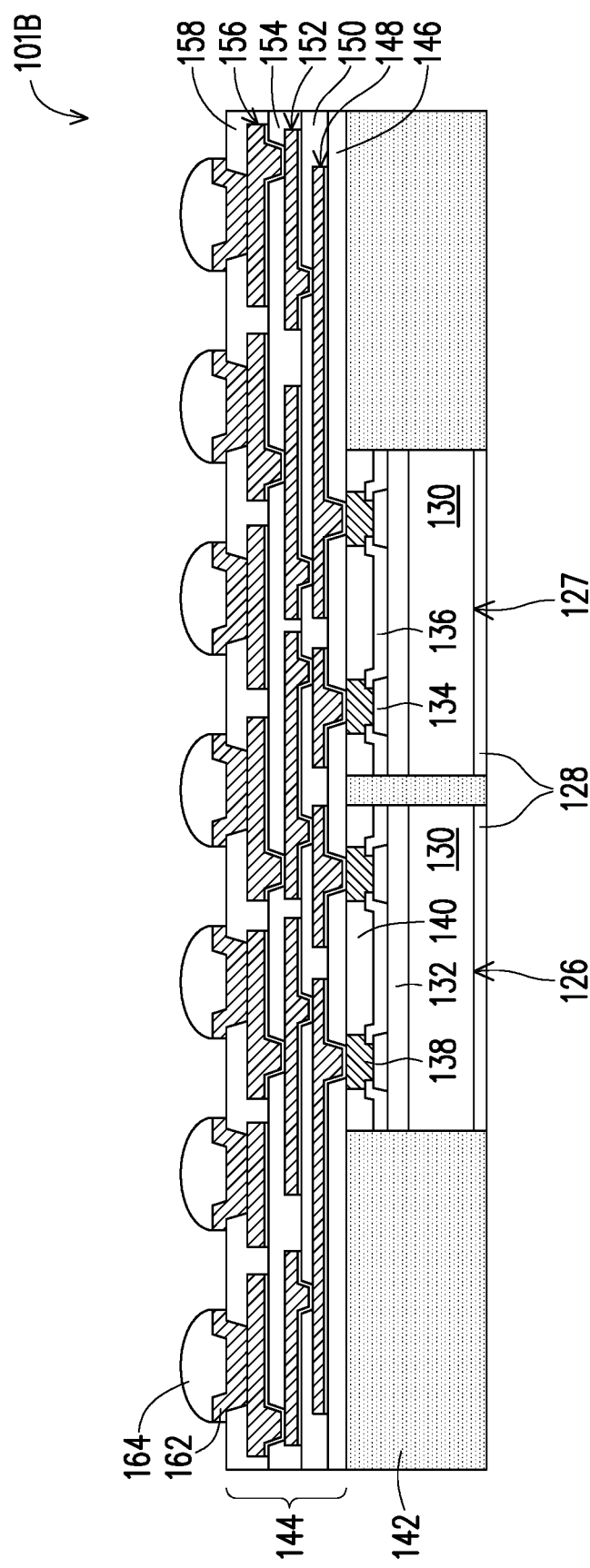
Figure 5D:
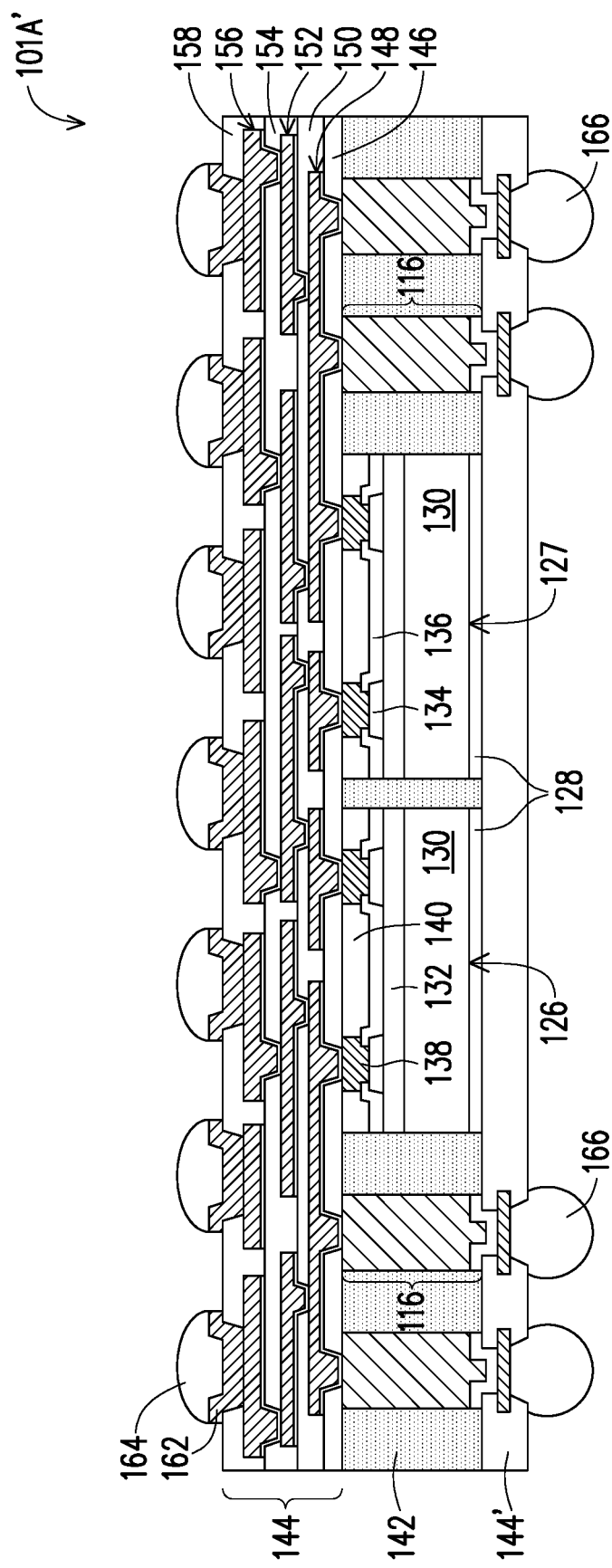

Referring to FIGS. 1E and 3F, conductive connectors 164 are formed on the UBMs 162. The conductive connectors 164 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 164 includes (such as a copper pillar) formed by a sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process. In another embodiment, the conductive connectors 164 may include a conductive material such as solder, copper, aluminum, gold, nickel, silver, palladium, tin, the like, or a combination thereof. In some embodiments, the conductive connectors 164 are formed by initially forming a layer of solder through such commonly used methods such as evaporation, electroplating, printing, solder transfer, ball placement, or the like. Once a layer of solder has been formed on the structure, a reflow process may be performed in order to shape the material into the desired bump shapes.

Figure 1F:
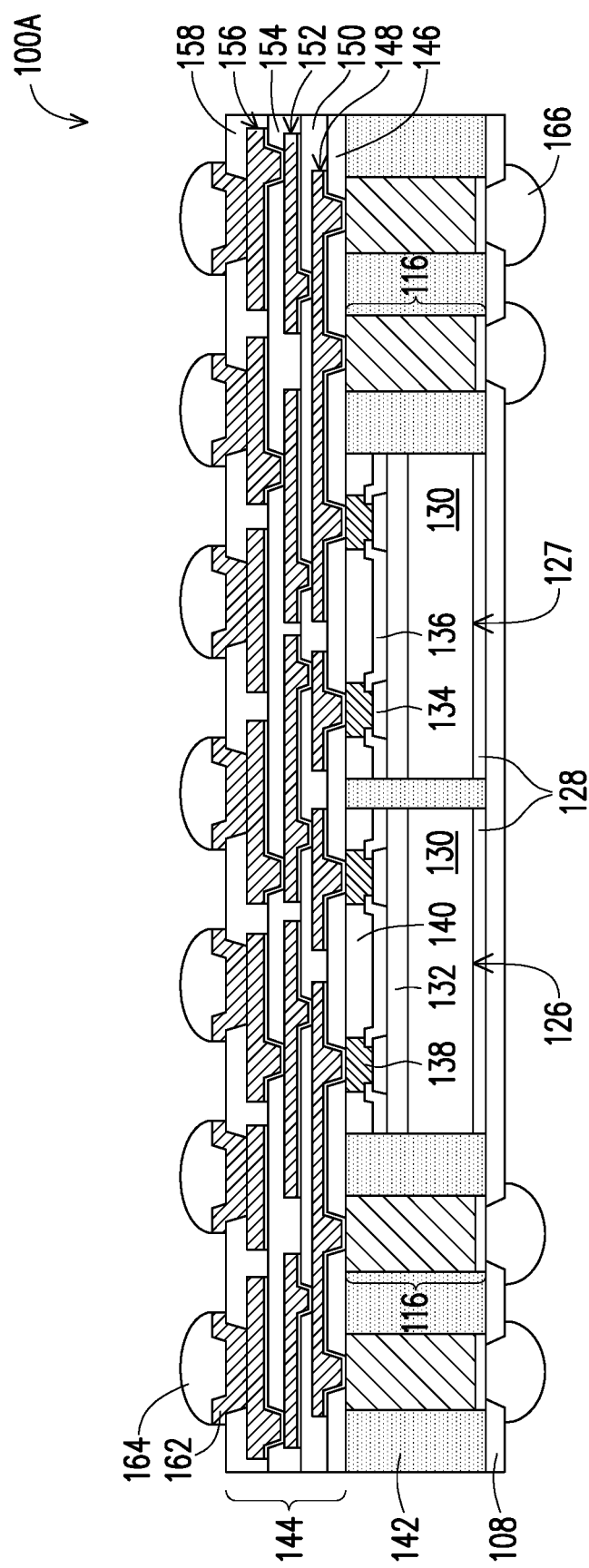

Referring to FIGS. 1E and 1F, a carrier substrate de-bonding is performed to detach (or "de-bond") the carrier substrate 102 from the encapsulant 142 and the adhesive 128 to form a package. In accordance with some embodiments, the de-bonding includes projecting a light such as a laser light or an UV light on the release layer 104 so that the release layer 104 decomposes under the heat of the light and the carrier substrate 102 may be removed. The package is then flipped over and placed on a tape (not shown).

Referring to FIG. 1F, in some embodiments, conductive connectors 166 are formed on the UBMs 162 to electrically connect to the through vias 116 and the IC dies 126 and 127 through the Front-side RDL structure 144, and thereby forming a device package 100A. In some embodiments, the conductive connectors 166 may be formed in a manner similar to the conductive connectors 164, and may be formed of the same material as the conductive connectors 164.

FIGS. 5A to 5D are schematic cross-sectional views illustrating device packages 100B, 101A, 101B and 101A' according to some embodiments of the disclosure.

In the above embodiment, such as FIG. 1F, there are two through vias 116 on each side of the IC dies 126 and 127, respectively. In other embodiments, more or fewer TIVs 116 may be embedded in the encapsulant 142. In addition, the number of through vias 116 on either side of IC dies 126 and 127 may be the same or different. Furthermore, there may be no through vias on each side of the IC dies 126 and 127, respectively. For example, in the device package 100B shown in FIG. 5A, there are no through via on either side of the IC dies 126 and 127.

Further, in the above embodiment, such as FIG. 1F, there are the bottom dielectric layer 108 on the back-side surfaces of the IC dies 126 and 127, the encapsulant 142 and the through vias 116. In other embodiments, there are no bottom dielectric layer 108 on the back-side surfaces of the IC dies 126 and 127, the encapsulant 142 and the through vias 116. For example, in the device packages 101A and 101B shown in FIGS. 5B and 5C, there are no bottom dielectric layer 108 on the back-side surfaces of the IC dies 126 and 127 and the encapsulant 142, respectively.

In addition, in some embodiments, the bottom dielectric layer 108 may be replaced by a back-side RDL structure 144'. For example, in the device package 101A' shown in FIG. 5D, the conductive connectors 166 are electrically connected to the through vias 116 through the back-side RDL structure 144'. The back-side RDL structure 144' may be formed in a manner similar to the front-side RDL structure 144, 244 or 344 (described below), and may be formed of the same material as the front-side RDL structure 144, 244 or 344. The back-side RDL structure 144' is shown as an example. More or fewer dielectric layers and metallization patterns may be formed in the back-side RDL structure 144'.

Furthermore, although one IC die 126 and one IC die 127 are illustrated as being adhered in a package region, it should be appreciated that one integrated circuit die 126 or more IC dies 126 and 127 may be adhered in each package region. For example, one integrated circuit die 126 may be adhered in each region, one integrated circuit die 126 and multiple IC dies 127, multiple IC dies 126 or multiple IC dies 127 may be adhered in each region. Further, the IC dies 126 and 127 may vary in size.

Figure 6A:
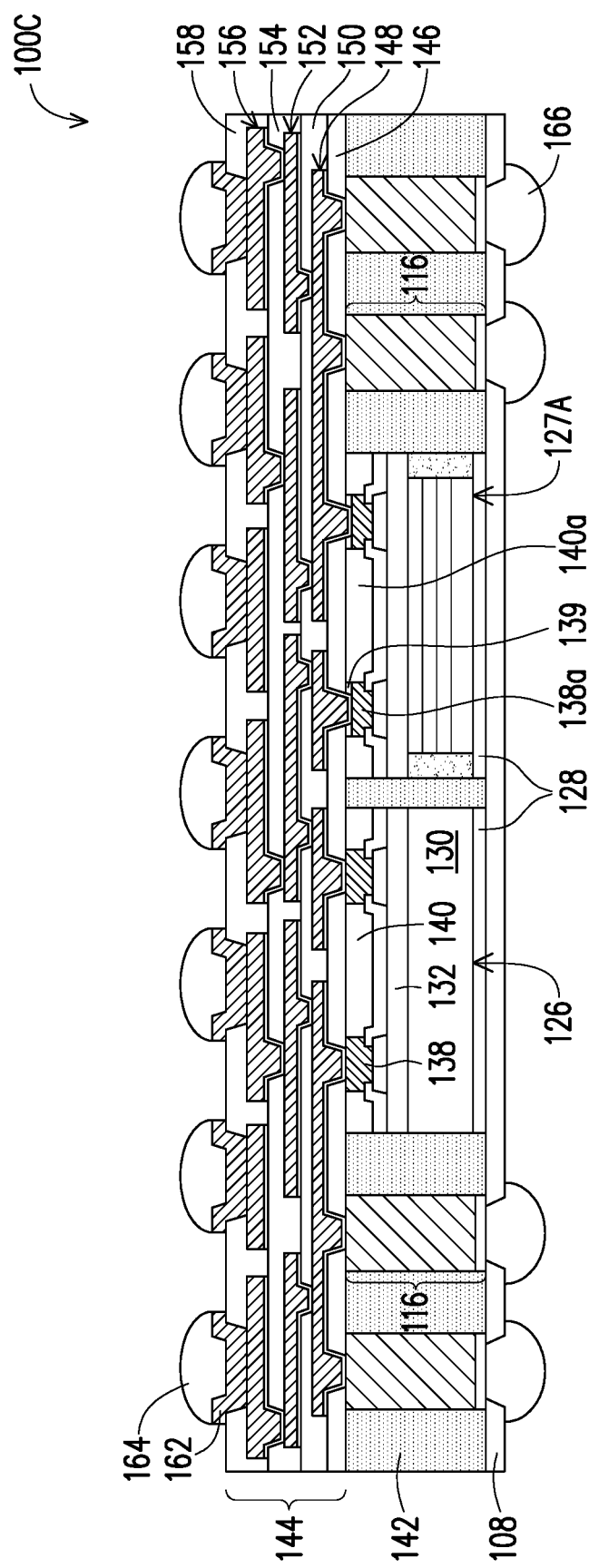
FIGS. 6A and 6B are schematic cross-sectional views illustrating device packages according to some embodiments of the disclosure.
Figure 6B:
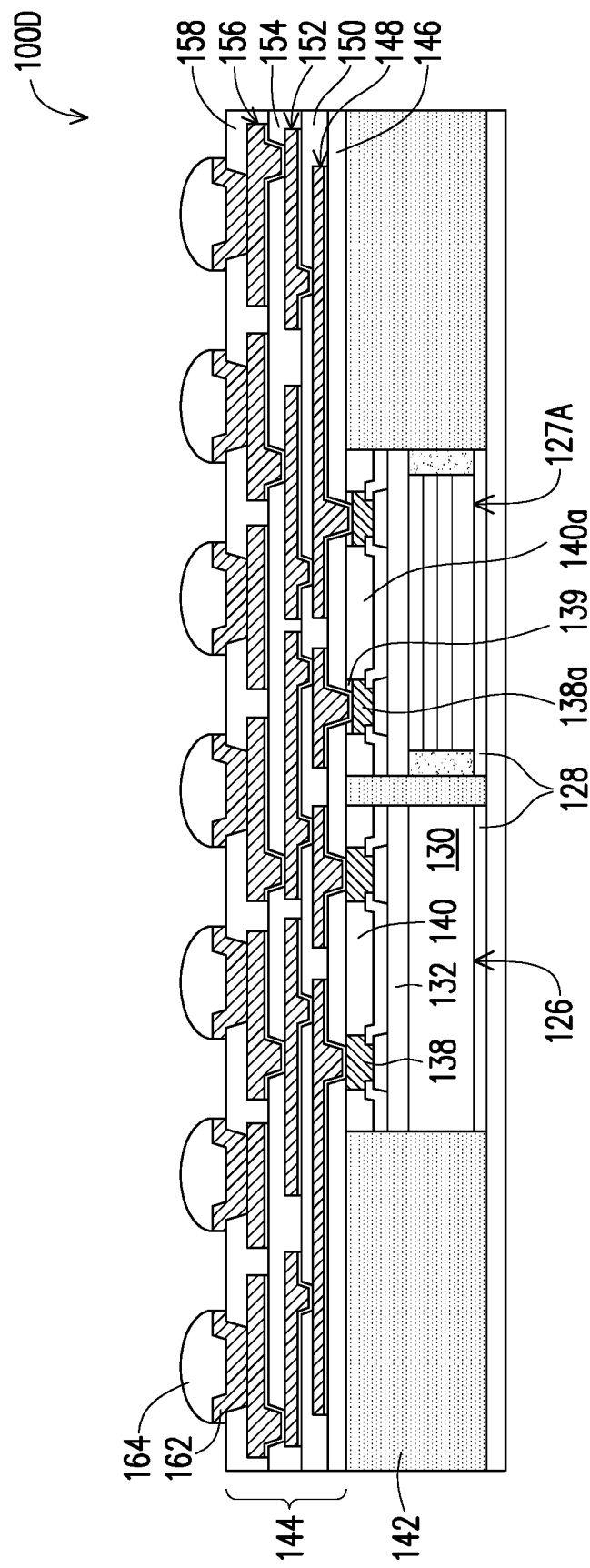

FIGS. 6A and 6B are schematic cross-sectional views illustrating device packages 100C and 100D according to some embodiments of the disclosure.

Referring to FIGS. 6A and 6B, the device packages 100C and 100D are similar to the device package 100A and 100B illustrated in FIGS. 1F and 5 respectively, and the difference is that the device package 100C and 100D each include the IC die 126 and the IC die 127A. The IC die 126 may be a die with a large footprint, such as a system-on-chip (SoC) device, and the IC die 127A may be a memory die, such as a stack of memory dies (e.g., DRAM dies, SRAM dies, high-bandwidth memory (HBM) dies, hybrid memory cubes (HMC) dies, or the like). In other some embodiments, the IC die 127A has die connectors 138 and conductive caps 139 on the die connectors 138, and the die connectors 138 includes conductive pillars, and the conductive caps 139 include metal. In some embodiments, the conductive pillars include a conductive material such as copper, aluminum, gold, nickel, palladium, the like, or a combination thereof, and may be formed by sputtering, printing, electro plating, electroless plating, CVD, or the like. The conductive caps 139 include nickel, tin, tin-lead, gold, copper, silver, palladium, indium, nickel-palladium-gold, nickel-gold, the like, or a combination thereof and may be formed by a plating process.

Figure 7A:
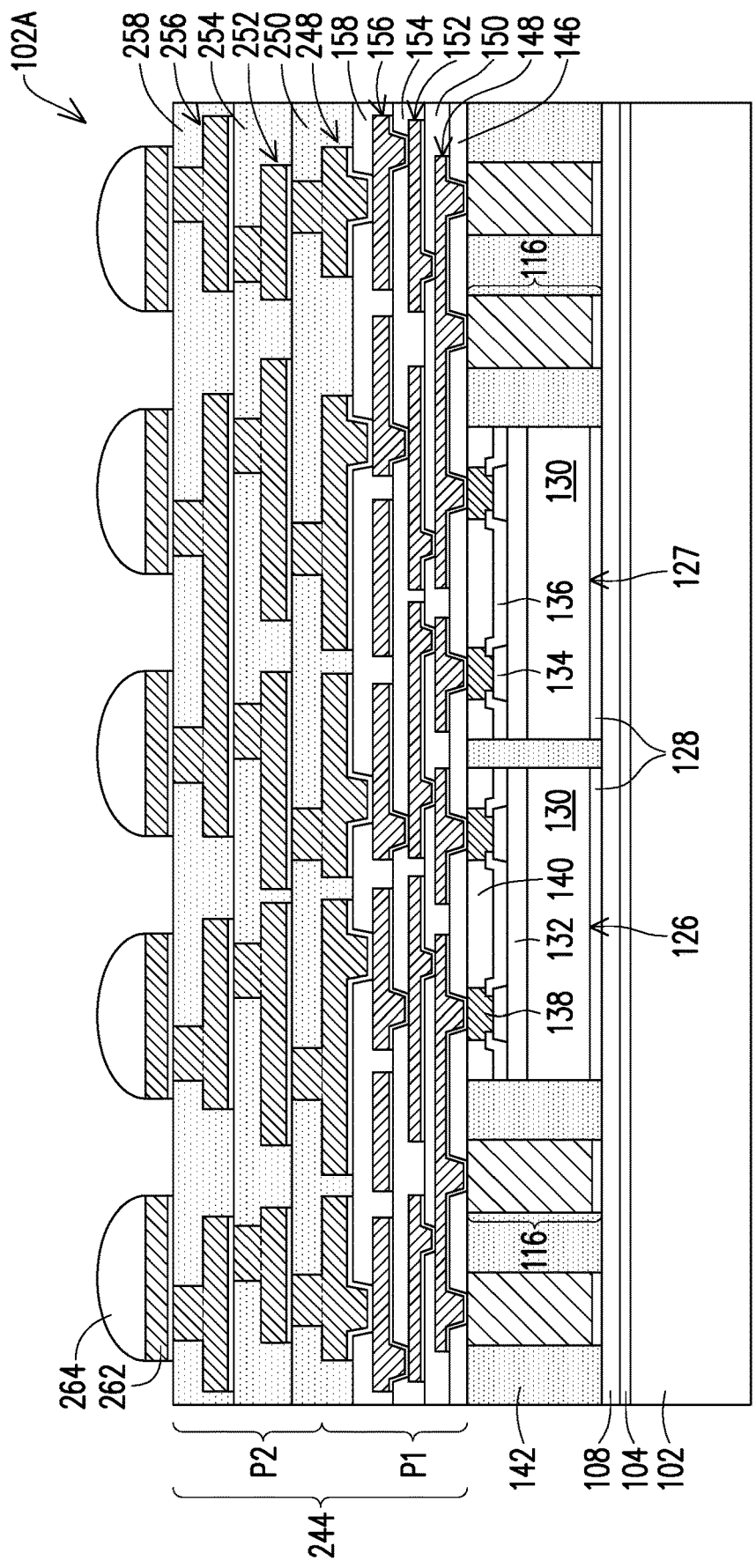
FIGS. 7A through 7B are schematic cross-sectional views illustrating a method of manufacturing a device package according to some embodiments of the disclosure.
Figure 7B:
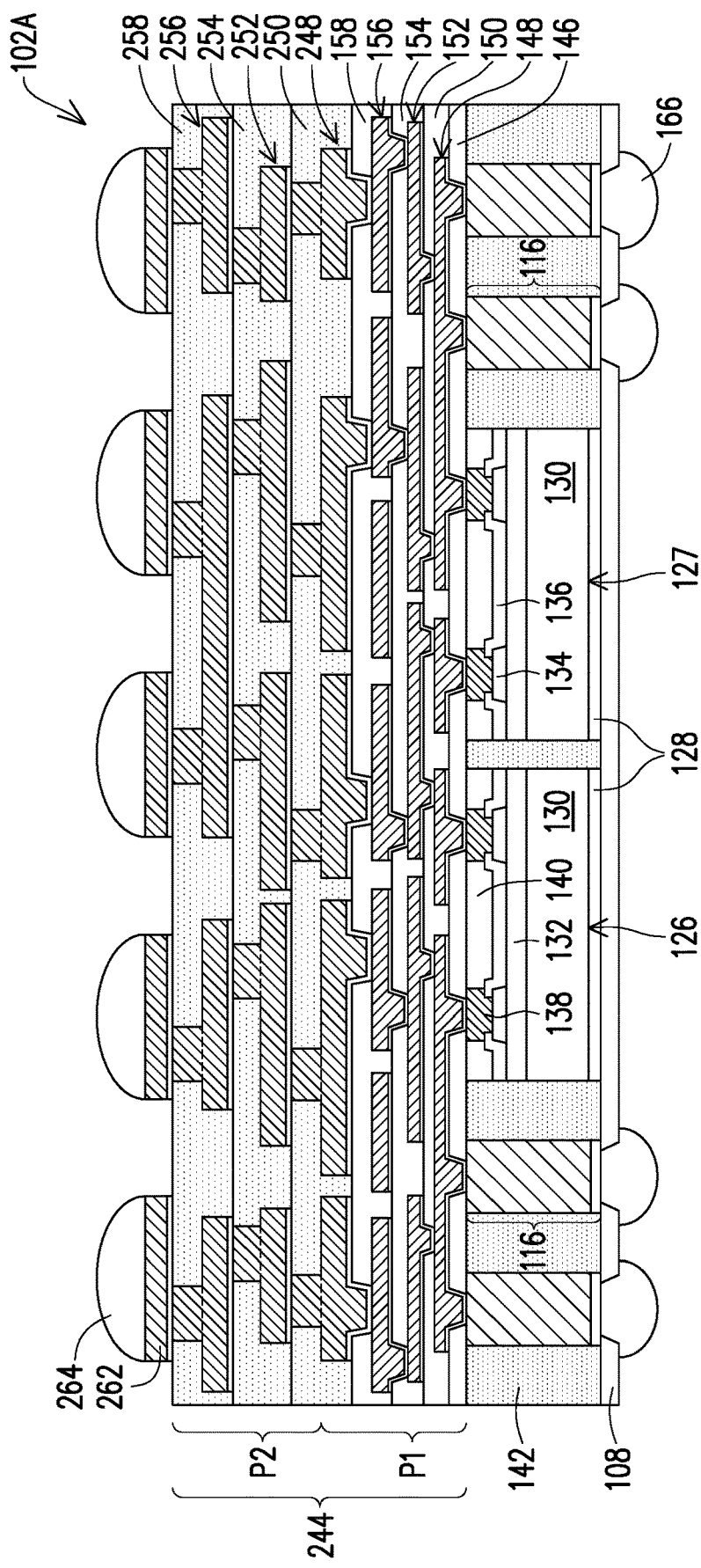
Figure 8:
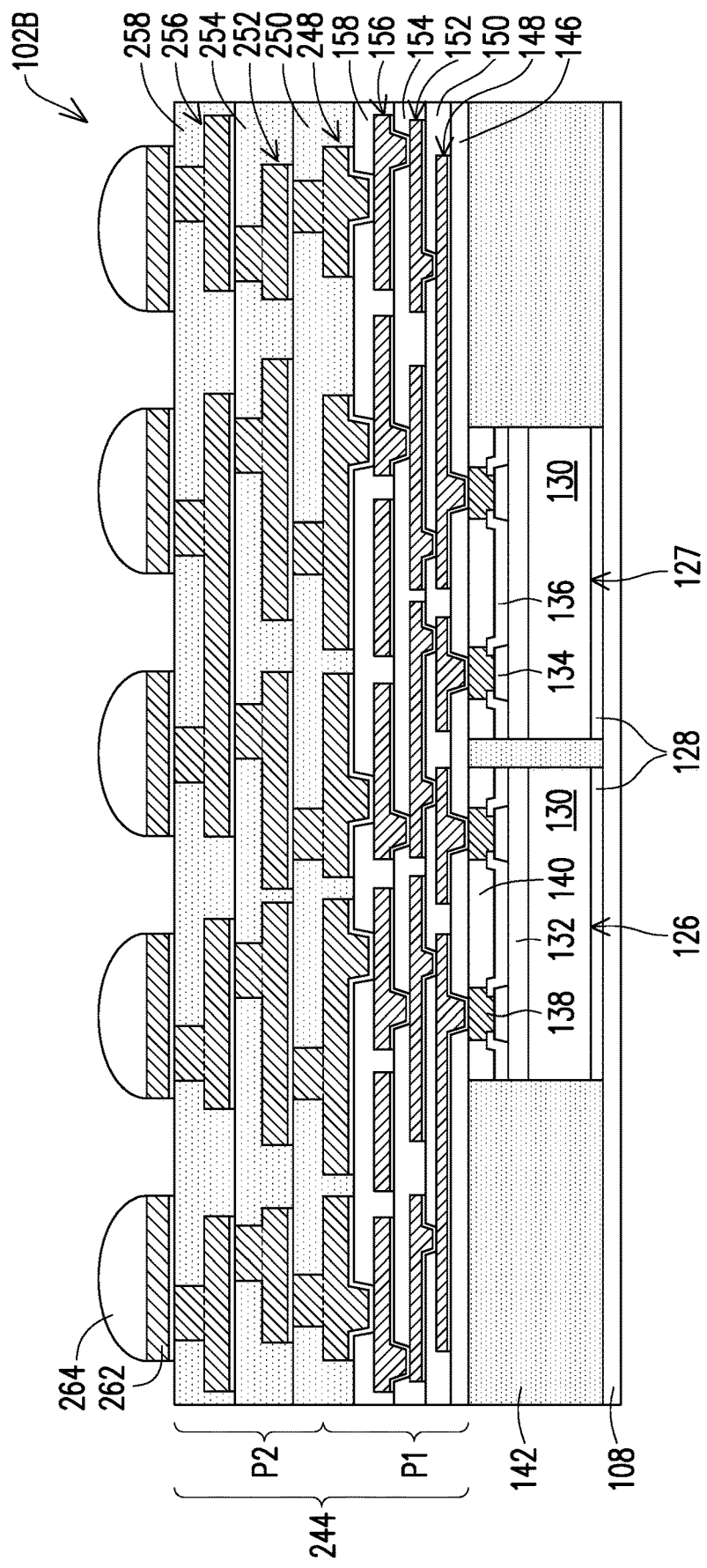
FIG. 8 is schematic cross-sectional view illustrating a device package according to some embodiments of the disclosure.

FIGS. 7A through 7B are schematic cross-sectional views illustrating a method of manufacturing a device package 102A according to some embodiments of the disclosure. FIG. 8 is schematic cross-sectional view illustrating a device package 102B according to some embodiments of the disclosure.

Referring to FIGS. 7B and 8, the device packages 102A and 102B are similar to the device package 100A and 100 illustrated in FIGS. 1E and 5 respectively, and the difference is that a front-side redistribution structure 244, which is included in the device package 102A and 102B, includes more dielectric layers and metallization patterns, respectively.

Referring to FIG. 7A, in some embodiments, the front-side redistribution structure 244 includes a first redistribution structure P1, and a second redistribution structure P2 on the first redistribution structure P1. The first redistribution structure P1 includes the dielectric layers 146, 150, 154, and 158, and the metallization patterns 148, 152, and 156. The second redistribution structure P2 includes dielectric layers 250, 254, and 258, and the metallization patterns 248, 252, and 256, and under bump metallurgies (UBMs) 262.

The materials and formations of the dielectric layers 146, 150, 154, and 158, and the metallization patterns 148, 152, and 156 may be the same as or similar to the materials and formations of the corresponding parts of the device package 100A and 100B as illustrated in FIGS. 1E and 5.

Figure 9A:
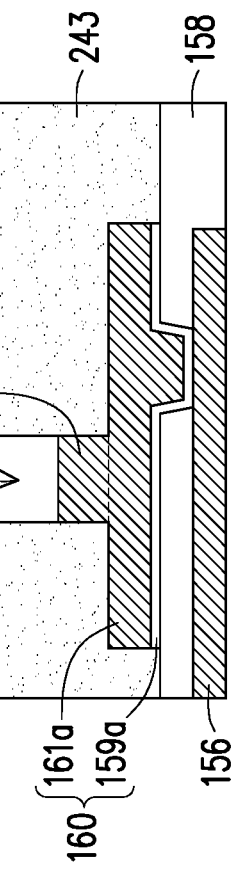

Referring to FIGS. 7A, 8, and 9A, after the dielectric layer 158 is formed, the metallization pattern 160 may be formed on and in the dielectric layer 158. The metallization pattern 160 includes a seed layer 159a and a conductive material 161a. The metallization pattern 160 may be formed in a manner similar to the metallization pattern 148, and may be formed of the same material as the metallization pattern 148. The metallization pattern 160 includes conductive line CL4 on and extending along the top surface of the dielectric layer 158, and conductive via V4 extending through the dielectric layer 158 to be physically and electrically connected to the conductive line CL.

Figure 9B:
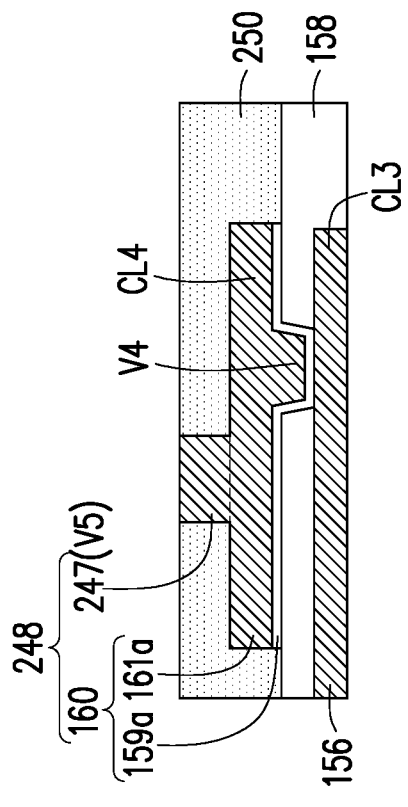

Referring to FIGS. 7A, 8, and 9B, as an example to form the second redistribution structure P2 of the front-side redistribution structure 244, a photoresist 243 is then formed and patterned on the metallization pattern 148 and the dielectric layer 158. The photoresist 243 may be formed by spin coating or the like and may be exposed to light for patterning. The patterning forms a via opening 241 through the photoresist 243 to expose the metallization pattern 160. After the photoresist 243 is patterned, the photoresist 243 may be referred to as a patterned mask layer.

Figure 9C:
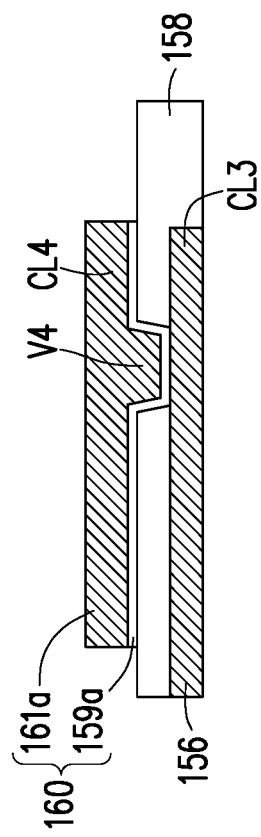

Referring to FIGS. 9B and 9C, a conductive material 247 is then formed in the via openings 241 of the photoresist 243 and on the exposed portions of the metallization pattern 160. The conductive material 247 may be formed by plating, such as electroplating or electroless plating, or the like. The conductive material 247 may include a metal, like copper, titanium, tungsten, aluminum, or the like. In some embodiments, the conductive material 247 forms a conductive via V5, and the conductive material 247 and the metallization pattern 160 form the metallization pattern 248.

Referring to FIG. 9C, the photoresist 243 is removed. The photoresist 243 may be removed by an acceptable ashing or stripping process, such as using an oxygen plasma or the like.

Figure 9D:
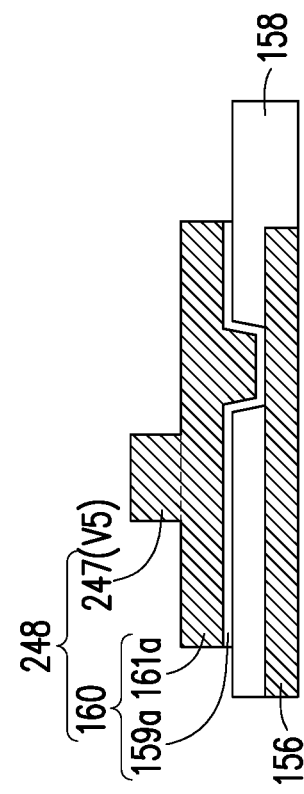

Referring to FIG. 9D, once the photoresist 243 is removed, the dielectric layer 250 is deposited on the dielectric layer 158, and the metallization pattern 248. In some embodiments, the dielectric layer 250 and 146 have different materials. In alternative embodiments, the dielectric layer 250 and 146 have the same material.

In some embodiments, the material of the dielectric layer 250 may be similar to the material of the encapsulant 142, and the difference is that the content of the fillers in the dielectric layer 250 is greater than 30 wt %, such as 30 wt % to 80 wt % or more, based on the total weight of the dielectric layer 250.

The dielectric layer 250 may be applied by compression molding, transfer molding, spin-coating, lamination, deposition, or similar processes, and may be formed over the carrier substrate 102 such that the metallization pattern 248 and/or the metallization pattern 160 are buried or covered. The dielectric layer 250 is then cured. A planarization process is then performed on the dielectric layer 250 to remove a portion of the dielectric layer 250, such that the top surfaces of the metallization pattern 248 is exposed. In some embodiments, top surfaces of the metallization pattern 248 and the dielectric layer 250 are substantially coplanar after the planarization process. The planarization process may be, for example, a chemical-mechanical polish (CMP), a grinding process, or the like. In some embodiments, the planarization may be omitted, for example, if the metallization pattern 248 is already exposed.

The metallization pattern 248 includes the conductive material 247 and the metallization pattern 160. The conductive material 247 may be a conductive via V5, and the metallization pattern 160 may include a conductive line CL4 and a conductive via V4. The conductive line CL4 is formed on and extending along the top surface of the dielectric layer 158. The conductive via V4 extends through the dielectric layer 158 to be physically and electrically connected to the conductive line CL3, while the via 5 is formed on and physically and electrically connected to the conductive line CL4. The via 5 and the conductive line CL4 are encapsulated by the dielectric layer 250. The sidewalls of the conductive vias V4 and V5 and the conductive lines CL4 may be straight or inclined. In addition, the conductive line CL4 may be a conformal layer, and has a recess on the conductive via V4.

Figure 9E:
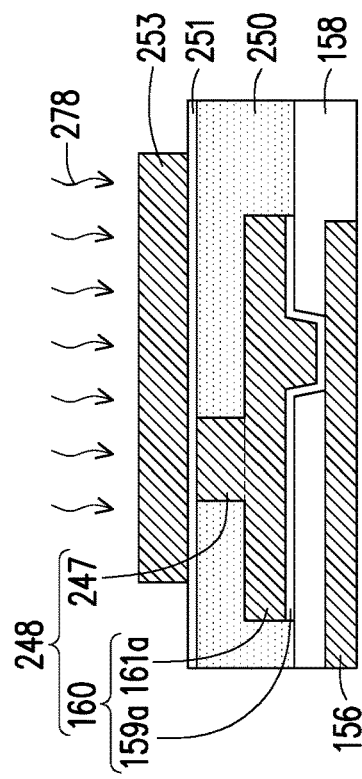

Referring to FIG. 9E and steps S10 and S12 of FIG. 17, a seed layer 251 is formed over the dielectric layer 250. The seed layer 251 may be formed in a manner similar to the seed layer 115, and may be formed of the same material as the seed layer 115. A photoresist 249 is formed and patterned on the seed layer 251. The photoresist 249 may be formed in a manner similar to the photoresist 143, and may be formed of the same material as the photoresist 143.

Referring to FIG. 9E and step S14 of FIG. 17, a conductive material 253 is formed in openings of the photoresist 249 and on the exposed portions of the seed layer 251. The conductive material 253 may be formed may be formed in a manner similar to the conductive material 147, and may be formed of the same material as the conductive material 147.

Figure 9F:
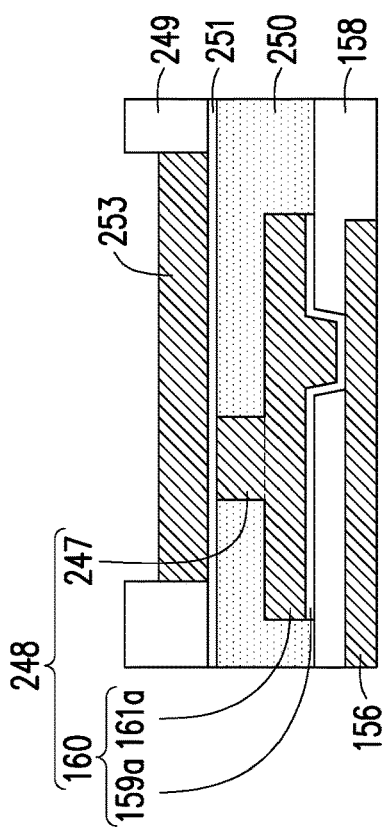
Figure 9G:
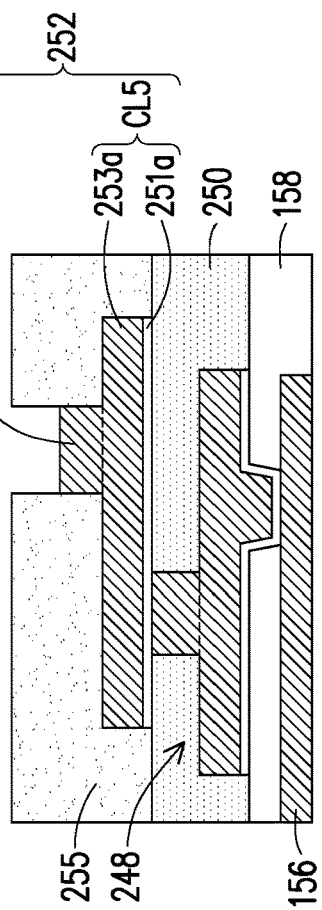

Referring to FIG. 9F and step S16 of FIG. 17, the photoresist 249 may be removed in a manner similar to the photoresist 143. Referring to FIGS. 9F and 9G and step S18 of FIG. 17, once the photoresist 249 is removed, exposed portions of the seed layer 251 are removed by using an acceptable etching process, such as by a wet or a dry etching process. In some embodiments, the exposed portions of the seed layer 251 are removed by a wet etching process 278. The wet etching process 278 may be performed by using an etching solution the same as the etching solution for etching the seed layer 115 as illustrated in FIGS. 2C and 3A to 3D. After the wet etching process 278, a seed layer 251a and a conductive material 253a are left, and the seed layer 251a and the conductive material 253a form a conductive line CL5.

Figure 9H:
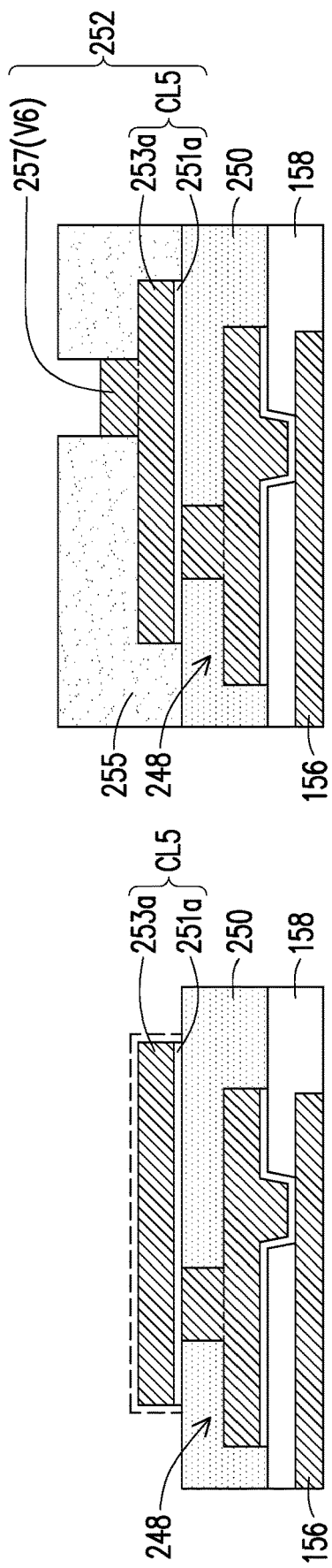

Referring to FIG. 9H, a photoresist 255 is formed and patterned on the conductive material 253a. The photoresist 255 may be formed may be formed in a manner similar to the photoresist 243, and may be formed of the same material as the photoresist 243.

A conductive material 257 is then formed in a via opening of the photoresist 255 and on the exposed portions of the conductive material 253a. The conductive material 257 may be formed may be formed in a manner similar to the conductive material 147, and may be formed of the same material as the conductive material 147. The conductive material 257 is a conductive via V6 on the conductive line CL5. The conductive via V6 and the conductive line CL5 forms the metallization pattern 252.

Referring to FIG. 9, the photoresist 255 is removed. The photoresist 255 may be removed in a manner similar to the photoresist 143. Once the photoresist 255 is removed, the dielectric layer 254 is formed on the dielectric layer 250. The dielectric layer 254 may be formed in a manner similar to the dielectric layer 250, and may be formed of the same material as the dielectric layer 250. In some embodiments, a top surface of the dielectric layer 254 and a top surface of the conductive via V6 are substantially coplanar, and a bottom surface of the dielectric layer 254 and a bottom surface of the seed layer 251a are substantially coplanar.

Referring to FIG. 9J, the metallization pattern 256 and the dielectric layer 258 are formed on the dielectric layer 254 and the metallization pattern 252. The dielectric layer 258 may be formed in a manner similar to the dielectric layer 250, and may be formed of the same material as the dielectric layer 250. The metallization pattern 256 may be formed in a manner similar to the metallization pattern 252, and may be formed of the same material as the metallization pattern 252. The metallization pattern 256 includes is a conductive line CL6 and a conductive via V7 on the conductive line CL6. In some embodiments, a top surface of the dielectric layer 258 and a top surface of the conductive via V7 are substantially coplanar, and a bottom surface of the dielectric layer 258 and a bottom surface of the seed layer of the conductive line CL6 are substantially coplanar.

Referring to FIG. 9K, an UBM 262 are optionally formed on the dielectric layer 258. The UBMs 262 may be formed in a manner similar to the conductive line CL5, and may be formed of the same material as the conductive line CL5. The conductive connector 264 is formed on the UBM 262. The conductive connector 264 may be formed in a manner similar to the conductive connector 164, and may be formed of the same material as the conductive connector 164 as illustrated in FIG. 1E.

Figure 10A:
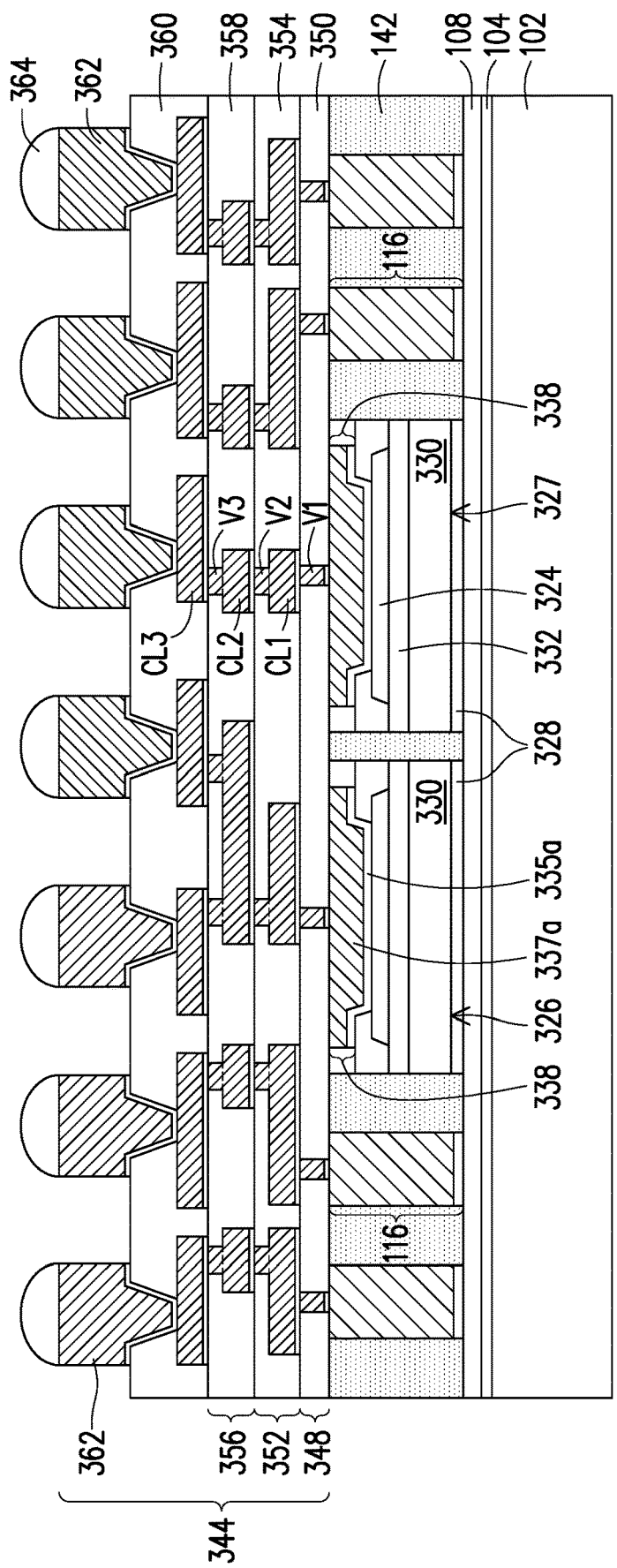
FIGS. 10A through 10B are schematic cross-sectional views illustrating a method of manufacturing a device package according to some embodiments of the disclosure.
Figure 10B:
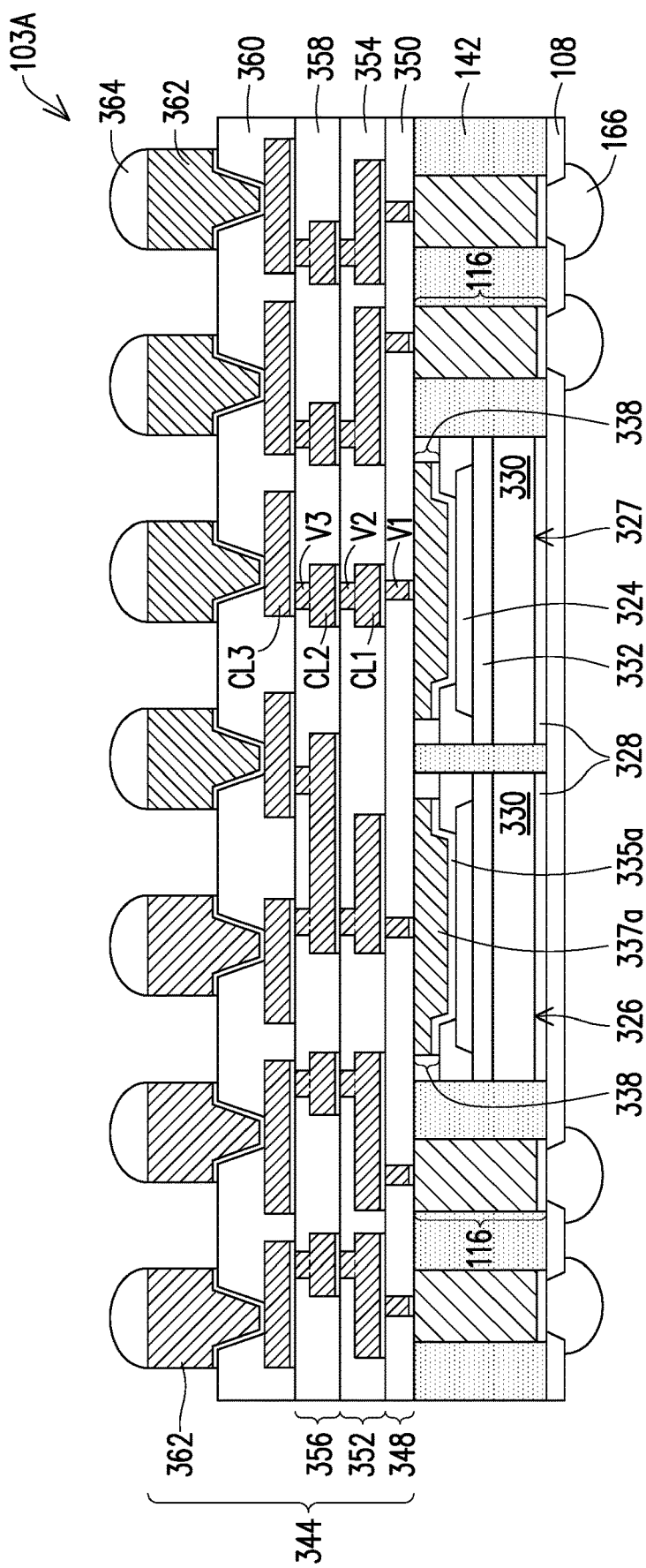
Figure 11:
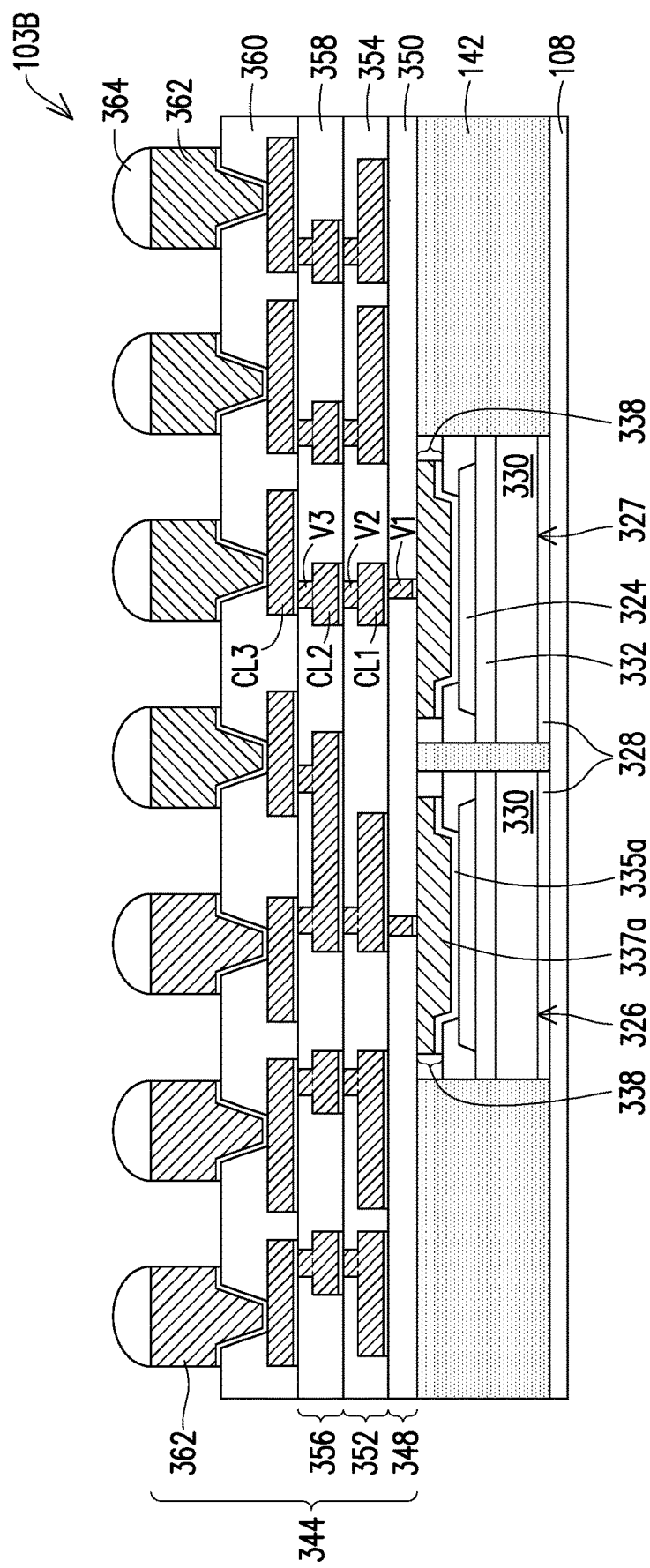
FIG. 11 is schematic cross-sectional view illustrating a device package according to some embodiments of the disclosure.

FIGS. 10A through 10B are schematic cross-sectional views illustrating a method of manufacturing a device package 103A according to some embodiments of the disclosure. FIG. 11 is schematic cross-sectional view illustrating a device package 103B according to some embodiments of the disclosure.

Referring to FIGS. 10B and 11, the device packages 103A and 103B are similar to the device package 100A and 100 as illustrated in FIGS. 1E and 5 respectively, and the differences are the IC dies 326 and 327 and a front-side redistribution structure 344 of the device packages 103A and 103B. The IC dies 326 and 327 are similar to the IC dies 126 and 127 in FIGS. 1E and 5, and the difference is that the formation of die connectors (or referred to as vias) 338 of the IC dies 326 and 327.

FIGS. 12A to 12D are schematic cross-sectional views illustrating a method of manufacturing IC dies 326 according to some embodiments of the disclosure.

Referring to FIG. 12A, as an example to form the IC dies 326, devices (not shown) and an interconnect structure 332 are formed on a semiconductor substrate (or referred to as a wafer) 330. Pads 334 are formed on the interconnect structures 332, and a passivation film 336 is formed on the interconnect structure 332 and on portions of the pads 334. Openings extend through the passivation film 336 to the pads 334. The material or formation of the semiconductor substrate 330, the interconnect structure 332, the pads 334, and the passivation film 336 may be the same as or similar to the corresponding parts of the IC die 126 as illustrated in FIG. 1C.

Referring to FIG. 12A and step 10 of FIG. 17, a seed layer 335 is formed over the pad 334 and the passivation film 336 and in the openings extending through the passivation film 336. In some embodiments, the seed layer 335 is a metal layer, which may be a single layer or a composite layer comprising a plurality of sub-layers formed of different materials. In some embodiments, the seed layer 335 includes a titanium layer and a copper layer over the titanium layer. The seed layer 335 may be formed using, for example, PVD or the like.

Referring to FIG. 12A and step S12 of FIG. 17, a photoresist 339 is then formed and patterned on the seed layer 335. The photoresist 339 may be formed by spin coating or the like and may be exposed to light for patterning. The pattern of the photoresist 339 corresponds to the die connectors 338. The patterning forms via openings through the photoresist 339 to expose the seed layer 335.

Referring to FIG. 12A and step S14 of FIG. 17, a conductive material 337 is then formed in the via openings of the photoresist 339 and on the exposed portions of the seed layer 335. The conductive material 337 may be formed by plating, such as electroplating or electroless plating, or the like. The conductive material 337 may include a metal, like copper, titanium, tungsten, aluminum, or the like.

Referring to FIG. 12B and step S16 of FIG. 17, the photoresist 339 is removed. The photoresist 339 may be removed by an acceptable ashing or stripping process, such as using an oxygen plasma or the like.

Referring to FIGS. 12B and 12C, and step S18 of FIG. 17, once the photoresist 339 is removed, exposed portions of the seed layer 335 are removed, such as by using an acceptable etching process, such as by a wet etching process 378. The wet etching process 378 may be performed by using an etching solution the same as or similar to the etching solution containing the protective agent for etching the seed layer 115 as illustrated in as illustrated in FIGS. 2C and 3A to 3D. After the wet etching process 378, a seed layer 335a and a conductive material 337a are left, and the seed layer 335a and the conductive material 337a form the die connectors 338.

Referring to FIG. 12C, a dielectric material 340 is formed on the active sides of the IC dies 326, such as on the passivation films 336 and the die connectors 338. The dielectric material 340 laterally encapsulates the die connectors 338. The material and formation of the dielectric material 140 may be the same as or similar to the dielectric material 140.

Referring to FIG. 12D, a die-saw (singulation) step is performed on the wafer to separate the wafer into a plurality of IC dies 326. In some embodiments, the singulation process may include sawing, laser ablation, etching, a combination thereof, or the like.

Referring to FIG. 10A, the IC dies 326 and 327 are adhered to the release layer 104 by an adhesive 128 after a release layer 104 and a bottom dielectric layer 108 are formed on the carrier substrate 102, and conductive pillars (or referred to as through vias) 116 are formed on the bottom dielectric layer 108. The materials and formations of the carrier substrate 102, the release layer 104, the bottom dielectric layer 108, and the conductive pillars 116 may be the same as or similar to the materials and formations of the corresponding parts as illustrated in FIGS. 1A to 1F. The formation of the IC die 327 may be the same as or similar to the formation of the IC die 326 as illustrated in FIGS. 12A to 12D. The IC dies 326 and 327 may be logic dies (e.g., central processing unit, microcontroller, etc.), memory dies (e.g., dynamic random access memory (DRAM) die, static random access memory (SRAM) die, etc.), power management dies (e.g., power management integrated circuit (PMIC) die), radio frequency (RF) dies, sensor dies, micro-electro-mechanical-system (MEMS) dies, signal processing dies (e.g., digital signal processing (DSP) die), front-end dies (e.g., analog front-end (AFE) dies), the like, or a combination thereof. Also, in some embodiments, the IC dies 326 and 327 may be in different sizes (e.g., different heights and/or surface areas), and in other embodiments, the IC dies 326 and 327 may be in the same size (e.g., same heights and/or surface areas).

Referring to FIG. 10A, an encapsulant 142 is formed to laterally encapsulate the conductive pillars 116 and the IC dies 326 and 327. The materials and formations of the encapsulant 142 may be the same as or similar to the materials and formations of the corresponding parts as illustrated in FIGS. 1D to 1F.

Referring to FIG. 10A, the front-side redistribution structure 344 is formed on the encapsulant 142, the conductive pillars 116, and the IC dies 326 and 327. The front-side redistribution structure 344 is similar to the second redistribution structure P2 of the front-side redistribution structure 244 as illustrated in FIGS. 7A and 7B, and the difference is that material of dielectric layers of the front-side redistribution structure 344.

FIGS. 13A to 13I are schematic cross-sectional views illustrating a method of manufacturing a front-side redistribution structure 344 and conductive connectors 364 according to some embodiments of the disclosure.

Referring to FIGS. 10A and 13A, and step S10 of FIG. 17, as an example to form the front-side redistribution structure 344, a seed layer 345 is formed over the encapsulant 142, the conductive pillars 116, and the IC dies 326 and 327. In some embodiments, the seed layer 345 may be formed in a manner similar to the seed layer 115, and may be formed of the same material as the seed layer 115 as illustrated in FIG. 2D.

Referring to FIG. 13A, and step S12 of FIG. 17, a photoresist 343 is then formed and patterned on the seed layer. The photoresist 343 may be formed by spin coating or the like and may be exposed to light for patterning. The pattern of the photoresist 343 corresponds to the metallization pattern 348. The patterning forms a via opening 349 through the photoresist 343 to expose the seed layer 345.

Referring to FIGS. 13A and 13B, and step S14 of FIG. 17, a conductive material 347 is then formed in the via openings 349 of the photoresist 343 and on the exposed portions of the seed layer 345. The conductive material 347 may be formed in a manner similar to the conductive material 247, and may be formed of the same material as the conductive material 247.

Referring to FIG. 13B, and step S16 of FIG. 17, the photoresist 343 is removed. The photoresist 343 may be removed by an acceptable ashing or stripping process, such as using an oxygen plasma or the like.

Referring to FIGS. 13B and 13C, and step S18 of FIG. 17, once the photoresist 343 is removed, exposed portions of the seed layer 345 are removed by a wet etching process 378. The wet etching process 378 may be performed in a manner the same as or similar to the wet etching process 118. After the wet etching process 378, a seed layer 345a and a conductive material 347a are left, and the seed layer 345a and the conductive material 347a form the metallization pattern 348. In some embodiments, the metallization pattern 348 is a conductive via, and thus may be referred to as a conductive via V1.

Referring to FIG. 13D, a dielectric layer 350 is deposited on the encapsulant 142, the through vias 116, and the die connectors 338. In some embodiments, the dielectric layer 350 is formed of a photo-sensitive material such as PBO, polyimide, BCB, or the like, which may be patterned using a lithography mask. The dielectric layer 350 may be formed by spin coating, lamination, CVD, the like, or a combination thereof. A planarization process is then performed on the dielectric layer 350 to remove a portion of the dielectric layer 350, such that the top surfaces of the metallization pattern 348 is exposed. In some embodiments, top surfaces of the metallization pattern 348 and the dielectric layer 350 are substantially coplanar after the planarization process. The planarization process may be, for example, a chemical-mechanical polish (CMP), a grinding process, or the like. In some embodiments, the planarization may be omitted, for example, if the metallization pattern 348 is already exposed. In some embodiments, a bottom surface of the seed layer 345a of the metallization pattern 348 and a bottom surface of the dielectric layer 350 are coplanar.

Referring to FIG. 13E, a metallization pattern 352 is formed on the metallization pattern 348 and the dielectric layer 350. The metallization pattern 352 includes a conductive line CL1 and a conductive via V2. The conductive line CL1 includes a seed layer 351a on the metallization pattern 348 and the dielectric layer 350, and a conductive material 353a on the seed layer 351a. The conductive via V2 includes conductive material 357 on the conductive material 353a. The metallization pattern 352 may be formed in a manner similar to the metallization pattern 252, and may be formed of the same material as the metallization pattern 252 as illustrated in FIGS. 9G to 9H.

Figure 13G:
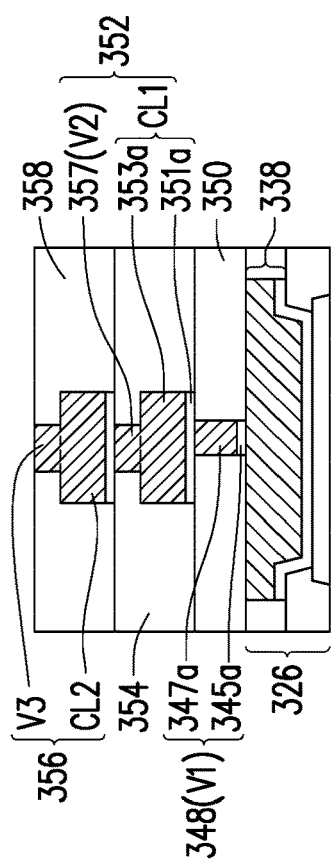

Referring to FIGS. 13F and 13G, after the metallization pattern 352 is formed, a dielectric layer 354 is formed on the dielectric layer 350, and a metallization pattern 356 and a dielectric layer 358 are formed on the dielectric layer 354 and the metallization pattern 352. The dielectric layers 354 and 358 may be formed in a manner similar to the dielectric layer 350, and may be formed of the same material as the dielectric layer 350. The metallization pattern 356 may be formed in a manner similar to the metallization pattern 252, and may be formed of the same material as the metallization pattern 252 as illustrated in FIGS. 9G to 9H. In some embodiments, a top surface of the dielectric layer 354 and a top surface of the conductive material 357 of the conductive via V2 are coplanar, and a bottom surface of the dielectric layer 354 and a bottom surface of the seed layer 351a of the conductive line CL1 are coplanar. In other some embodiments, a top surface of the dielectric layer 358 and a top surface of the conductive via V3 are coplanar, and a bottom surface of the dielectric layer 358 and a bottom surface of the seed layer of the conductive line CL2 are coplanar.

Figure 13H:
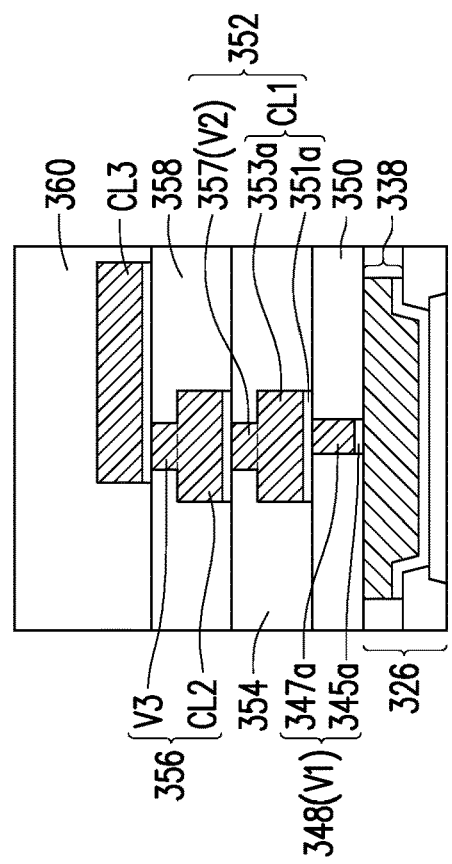

Referring to FIG. 13H, a conductive line CL3 and a dielectric layer 360 are formed on the dielectric layer 358 and the metallization pattern 356. The conductive CL3 may be formed in a manner similar to the conductive line CL5, and may be formed of the same material as the conductive line CL5 as illustrated in FIGS. 9E to 9G. The dielectric layer 360 may be formed in a manner similar to the dielectric layer 350, and may be formed of the same material as the dielectric layer 350. In some embodiments, a bottom surface of the dielectric layer 360 and a bottom surface of the seed layer of the conductive line CL3 are coplanar.

Figure 13I:
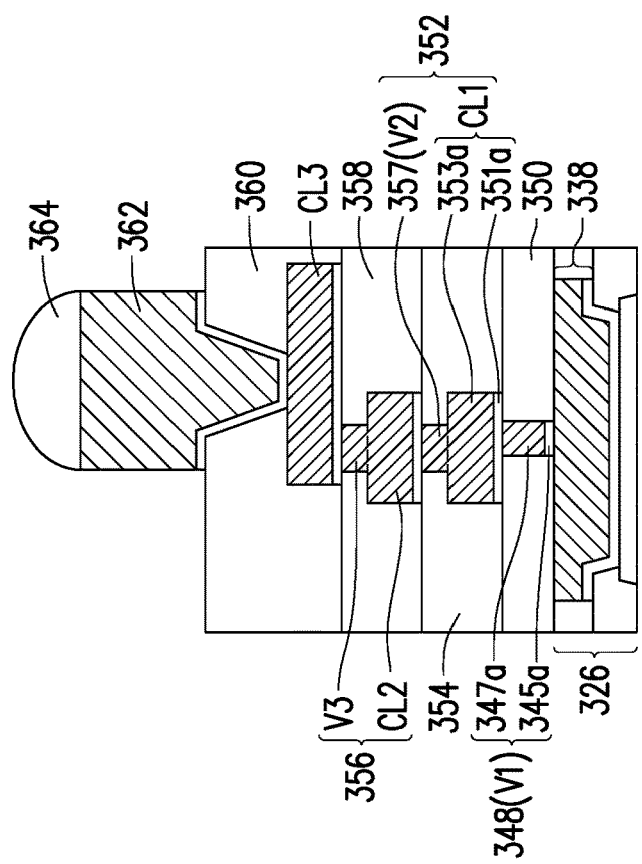

Referring to FIG. 13I, the dielectric layer 360 is then patterned. The patterning forms opening (not shown) exposing portion of the conductive CL3. The patterning may be by an acceptable process, such as by exposing the dielectric layer 360 to light when the dielectric layer 360 is a photo-sensitive material or by etching using, for example, an anisotropic etch. If the dielectric layer 360 is a photo-sensitive material, the dielectric layer 360 may be developed after the exposure.

Referring to FIG. 13I, an UBM 362 are optionally formed on the dielectric layer 360 and filled in the opening of the dielectric layer 360. The UBM 362 may be formed in a manner similar to the UBM 162, and may be formed of the same material as the UBM 162 as illustrated in FIGS. 1D and 3E. A conductive connector 364 is formed on the UBM 362. The conductive connector 364 may be formed in a manner similar to the conductive connector 164, and may be formed of the same material as the conductive connector 164 as illustrated in FIGS. 1E and 5.

FIGS. 14A through 14I are schematic cross-sectional views illustrating a method of manufacturing a component package 105A according to some embodiments of the disclosure.

Referring to FIG. 14A, IC dies 26 are placed on a temporary carrier 12. In some embodiments, the IC dies 26 are attached to the temporary carrier 12 by a temporary bonding layer 14. A material of the temporary carrier 12 may include glass, metal, ceramic, silicon, plastic, combinations thereof, multi-layers thereof, or other suitable material that may provide structural support for the IC dies 26 in subsequent processing. In some embodiments, the temporary carrier 12 is made of glass, and the temporary bonding layer 14 includes an adhesive layer (e.g., die attach film (DAF)), a ultra-violet (UV) cured layer, such as a light-to-heat conversion (LTHC) release coating, ultra-violet (UV) glue, which reduces or loses its adhesiveness when exposed to a radiation source (e.g., UV light or a laser). Other suitable temporary adhesives may be used.

Before being adhered to temporary bonding layer 14, the IC dies 26 may be processed according to applicable manufacturing processes to form integrated circuits in the IC dies 26. The IC dies 26 may be similar to the IC dies 126 or 326. For example, the IC dies 26 each include a semiconductor substrate 30, die connectors 38, and dielectric material 40. The IC dies 26 each may further include interconnect structures, pads, and a passivation film (not shown). The IC dies 26 may be formed in a manner similar to the IC dies 126 or 326. The semiconductor substrate 30, the die connectors 38, the dielectric material 40, the interconnect structures, the pads, and the passivation film may be formed of the same material as the corresponding parts of the IC dies 126 or 326.

Referring to 14A, an encapsulant $42_1$ is formed over and surrounding the IC dies 26. In some embodiments, the encapsulant $42_1$ may include one or more layers of non-photo-patternable insulating materials such as silicon nitride, silicon oxide, phosphosilicate glass (PSG), borosilicate glass (BSG), boron-doped phosphosilicate glass (BPSG), a combination thereof, or the like, and may be formed using CVD, PVD, ALD, a spin-on coating process, a combination thereof, or the like. In other embodiments, the encapsulant $42_1$ may include one or more layers of photo-patternable insulating materials such as polybenzoxazole (PBO), polyimide (PI), benzocyclobutene (BCB), a combination thereof, or the like, and may be formed using a spin-on coating process, or the like. Such photo-patternable insulating materials may be patterned using similar photolithography methods as a photoresist material. In other embodiments, the encapsulant $42_1$ may include a molding compound, such as an epoxy, a resin, a moldable polymer, a combination thereof, or the like. The molding compound may be applied while substantially liquid, and then may be cured through a chemical reaction, such as in an epoxy or resin. In other embodiments, the molding compound may be an ultraviolet (UV) or thermally cured polymer applied as a gel or malleable solid capable of being disposed around and between the IC dies 26.

The encapsulant $42_1$ and the IC dies 26 are planarized, such that front surfaces 26-FS of the IC dies 26 are substantially level or coplanar with a topmost surface of the encapsulant $42_1$. In some embodiments the encapsulant $42_1$ and the IC dies 26 may be planarized using a CMP process, a grinding process, an etching process, a combination thereof, or the like. In some embodiment, the planarization process exposes the die connectors 38, such that exposed surfaces of the die connectors 38 are substantially level or coplanar with the topmost surface of the encapsulant $42_1$.

Referring to FIG. 14B, an RDL structure $44_1$ are formed on the IC dies 26 and the encapsulant $42_1$. The RDL structure $44_1$ includes dielectric layers and metallization patterns. In some embodiments, the RDL structure $44_1$ may be formed in a manner the same as or similar to the front-side RDL structure 144, 244 or 344. The IC dies 26, the encapsulant $42_1$ and the RDL structure $44_1$ form a tier 1 structure $25_1$.

Figure 14C:
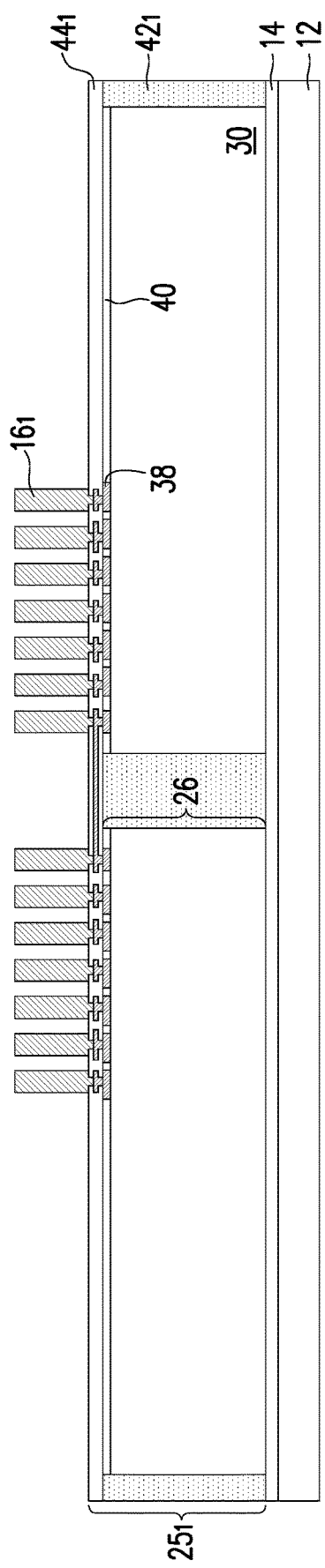

Referring to FIG. 14C, conductive pillars $16_1$ are formed on the RDL structure $44_1$. In some embodiments, the conductive pillars $16_1$ may be formed in a manner similar to the conductive pillars 116 as illustrated in FIG. 2C, and formed of the same material of the conductive pillars 116.

Figure 14D:
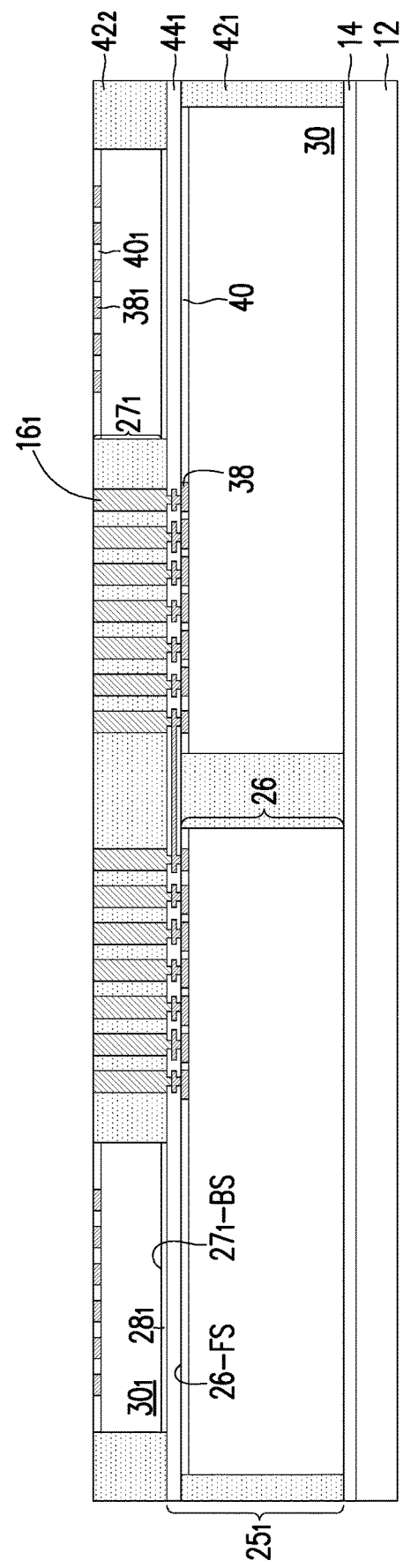

Referring to FIG. 14D, IC dies $27_1$ are adhered to the RDL structure $44_1$. The IC dies $27_1$ and the IC dies 26 are singulated from different wafers, and may be different in functions and properties. For example, the IC die 26 is a logic die (e.g., a system-on-a-chip (SoC), a central processing unit (CPU), a graphics processing unit (GPU), etc.). The IC die $27_1$ is a memory die (e.g., a dynamic random access memory (DRAM) die, a static random access memory (SRAM) die, a synchronous dynamic random access memory (SDRAM), a NAND flash, etc.). The IC dies $27_1$ each include a semiconductor substrate $30_1$, die connectors $38_1$, and dielectric material $40_1$. The IC dies $27_1$ each may further include interconnect structures, pads, and a passivation film (not shown). The IC dies $27_1$ may be formed in a manner similar to the IC dies 126 or 326. The semiconductor substrate $30_1$, the die connectors $38_1$, the dielectric material $40_1$, the interconnect structures, the pads, and the passivation film may be formed of the same material as the corresponding parts of the IC dies 126 or 326.

In some embodiments, the IC dies $27_1$ may be disposed on the IC dies 26 in a back-to-face configuration. For example, the back-side surface $27_1$-BS of the IC dies $27_1$ face toward the front surface 26-FS of the IC dies 26. The back-side surfaces are opposite to front-side surfaces. In some embodiments, the front surfaces may be referred to as first surfaces or active surfaces. The first surfaces are opposite to second surfaces, and the non-active surfaces are opposite to active side surfaces. In some embodiments, the IC dies $27_1$ are adhered to the RDL structure $44_1$ by an adhesive $28_1$. The adhesive $28_1$ is on the back-side surfaces $27_1$-BS of the IC dies $27_1$ and adheres the IC dies $27_1$ to the RDL structure $44_1$. The adhesive 28 may be applied to the back-side surfaces $27_1$-BS of the IC dies $27_1$ before singulating to separate the IC dies $27_1$. The adhesive $28_1$ may be any suitable adhesive, epoxy, die attach film (DAF), or the like.

Referring to 14D, the IC dies $27_1$ are encapsulated in an encapsulant $42_2$ is formed over the IC dies $27_1$. In some embodiments, the encapsulant $42_2$ may be formed using similar material and methods as the encapsulant $42_1$, and the description is not repeated herein. The conductive pillars $16_1$ penetrate the encapsulant $42_2$, and the conductive pillars $16_1$ are sometimes referred to as through vias $16_1$ or through integrated fan-out vias (TIVs) $16_1$. The conductive pillars $16_1$ are electrically connected to the IC dies 26 through the RDL structure $44_1$.

Figure 14E:
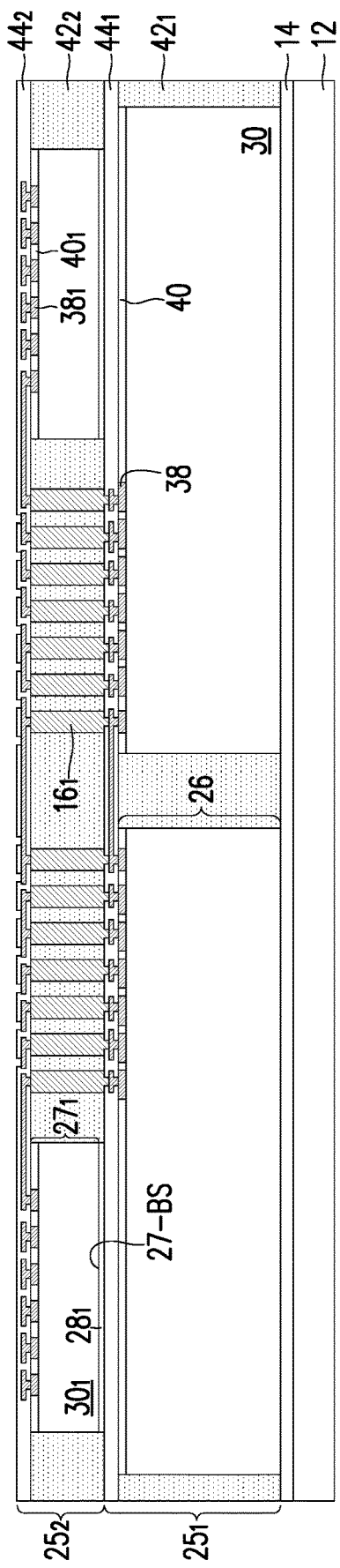

Referring to FIG. 14E, an RDL structure $44_2$ are formed on the IC dies $27_1$, the conductive pillars $16_1$ and the encapsulant $42_2$. In some embodiments, the RDL structure $44_2$ may be formed in a manner the same as or similar to the front-side RDL structure 144, 244 or 344. The RDL structure $44_2$ may be electrically connected to the IC dies $27_1$ and electrically connected to the IC dies 26 through the RDL structure $44_2$ and the conductive pillars $16_1$. The RDL structure $44_2$, the conductive pillars $16_1$, the IC dies $27_1$, and the encapsulant $42_2$ form a tier 2 structure $25_2$ over the tier 1 structure $25_1$.

Figure 14F:
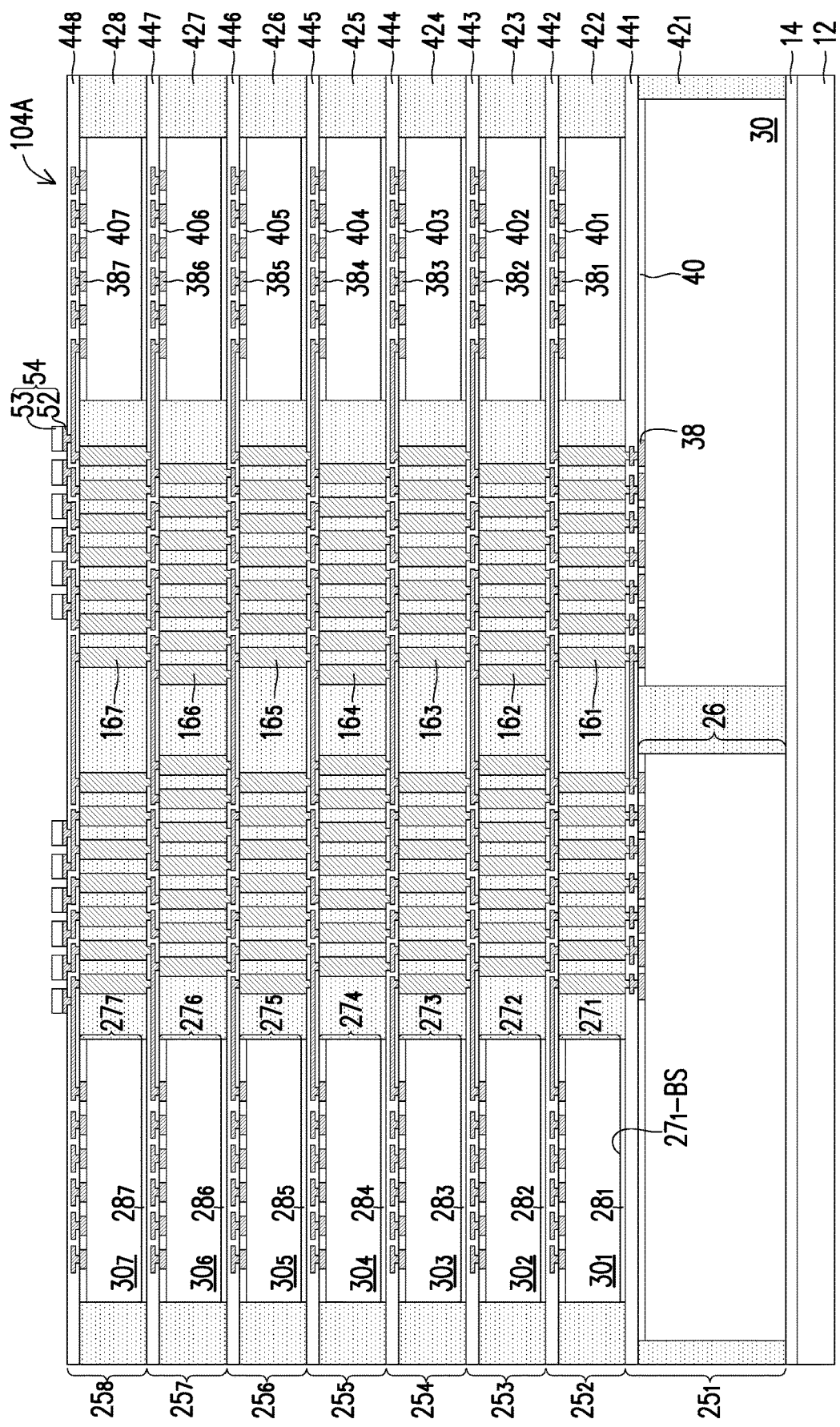

Referring to FIG. 14F, a tier 3 structure $25_3$, a tier 4 structure $25_4$, a tier 5 structure $25_5$, a tier 6 structure $25_6$, a tier 7 structure $25_7$, and a tier 8 structure $25_8$ are formed over the tier 2 structure $25_2$. The tier 3 structure $25_3$ includes an RDL structure $44_3$, the conductive pillars $16_2$, IC dies $27_2$, and an encapsulant $42_3$. The tier 4 structure $25_4$ includes an RDL structure $44_4$, the conductive pillars $16_3$, IC dies $27_3$, and an encapsulant $42_4$. The tier 5 structure $25_5$ includes an RDL structure $44_5$, the conductive pillars $16_4$, IC dies $27_4$, and an encapsulant $42_5$. The tier 6 structure $25_6$ includes an RDL structure $44_6$, the conductive pillars $16_5$, IC dies $27_5$, and an encapsulant $42_6$. The tier 7 structure $25_7$ includes an RDL structure $44_7$, the conductive pillars $16_6$, IC dies $27_6$, and an encapsulant $42_7$. The tier 8 structure $25_8$ includes an RDL structure $44_8$, the conductive pillars $16_7$, IC dies $27_7$, and an encapsulant $42_8$. In some embodiments, the IC dies $27_2$ to $27_7$ may be similar to the IC dies $27_1$, with similar features of the IC dies $27_2$ to $27_7$ and the IC dies $27_1$ being referred to with similar numerical references. In some embodiments, the encapsulants $42_3$ to $42_8$ may be formed using similar material and methods as the encapsulant $42_1$, and the description is not repeated herein. In some embodiments, the tier 3 structure $25_3$ to the tier 8 structure $25_8$ may be formed using similar methods as the tier 2 structure $25_2$ described above, and the description is not repeated herein.

Referring to FIG. 14F, conductive connectors 54 are formed on conductive pads at the top surface of the RDL structure $44_8$. In some embodiments, the conductive pads include UBMs. In the illustrated embodiment, the pads are formed in openings of the dielectric layers of the RDL structure $44_8$. In another embodiment, the pads (UBMs) may extend through an opening of a dielectric layer of the RDL structure $44_8$ and also extend across the top surface of the RDL structure $44_8$. In some embodiments, the pads (UBMs) may be formed in a manner similar to the UBMs 162, 262, or 362, and may be formed of the same material as the UBMs 162, 262, or 362.

In some embodiments, the conductive connector 54 include a conductive pillar 52 with a metal cap layer 53, which may be a solder cap, over the conductive pillar 52. The conductive connectors 54 including the conductive pillar 52 and the metal cap layer 53 are sometimes referred to as micro bumps 52/53. In some embodiments, the conductive pillar 52 includes a conductive material such as copper, aluminum, gold, nickel, palladium, the like, or a combination thereof and may be formed by sputtering, printing, electro plating, electroless plating, CVD, or the like. The conductive pillar 52 may be solder free and have substantially vertical sidewalls. In some embodiments, a metal cap layer 53 is formed on the top of the conductive pillar 52. The metal cap layer 53 may include nickel, tin, tin-lead, gold, copper, silver, palladium, indium, nickel-palladium-gold, nickel-gold, the like, or a combination thereof and may be formed by a plating process. In another embodiment, the conductive connectors 54 do not include the conductive pillars and are solder balls and/or bumps, such as controlled collapse chip connection (C4), electroless nickel immersion Gold (ENIG), electroless nickel electroless palladium immersion gold technique (EN EPIG) formed bumps, or the like. In this embodiment, the bump conductive connectors 54 may include a conductive material such as solder, copper, aluminum, gold, nickel, silver, palladium, tin, the like, or a combination thereof. In this embodiment, the conductive connectors 54 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes.

Figure 14G:
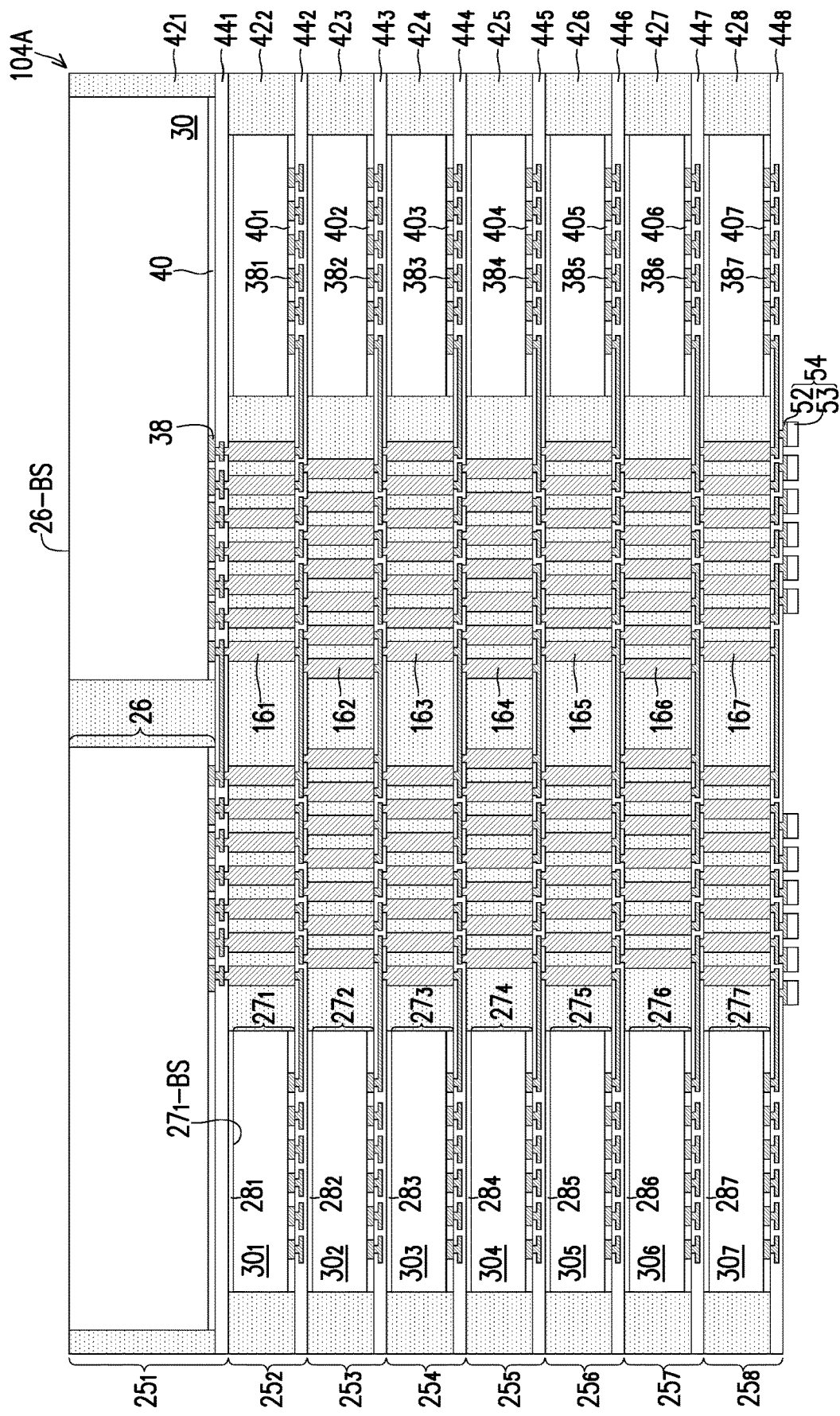

Referring to FIG. 14G, after forming the conductive connectors 54, another temporary carrier (not shown) is optionally attached to the tier 8 structure $25_8$ opposite to the temporary carrier 12. In some embodiments, before attaching another temporary carrier (not shown), other processes may be performed one the tier 8 structure $25_8$ depending on the design requirements. A de-bonding process is performed to release the temporary carrier 12 from the overlying structure, such that the back surface 26-BS of the IC dies 26 are exposed. In some embodiments, after the de-bonding of the temporary carrier 12, the back surface 26-BS of the IC dies 26 are cleaned for further processing.

Figure 14H:
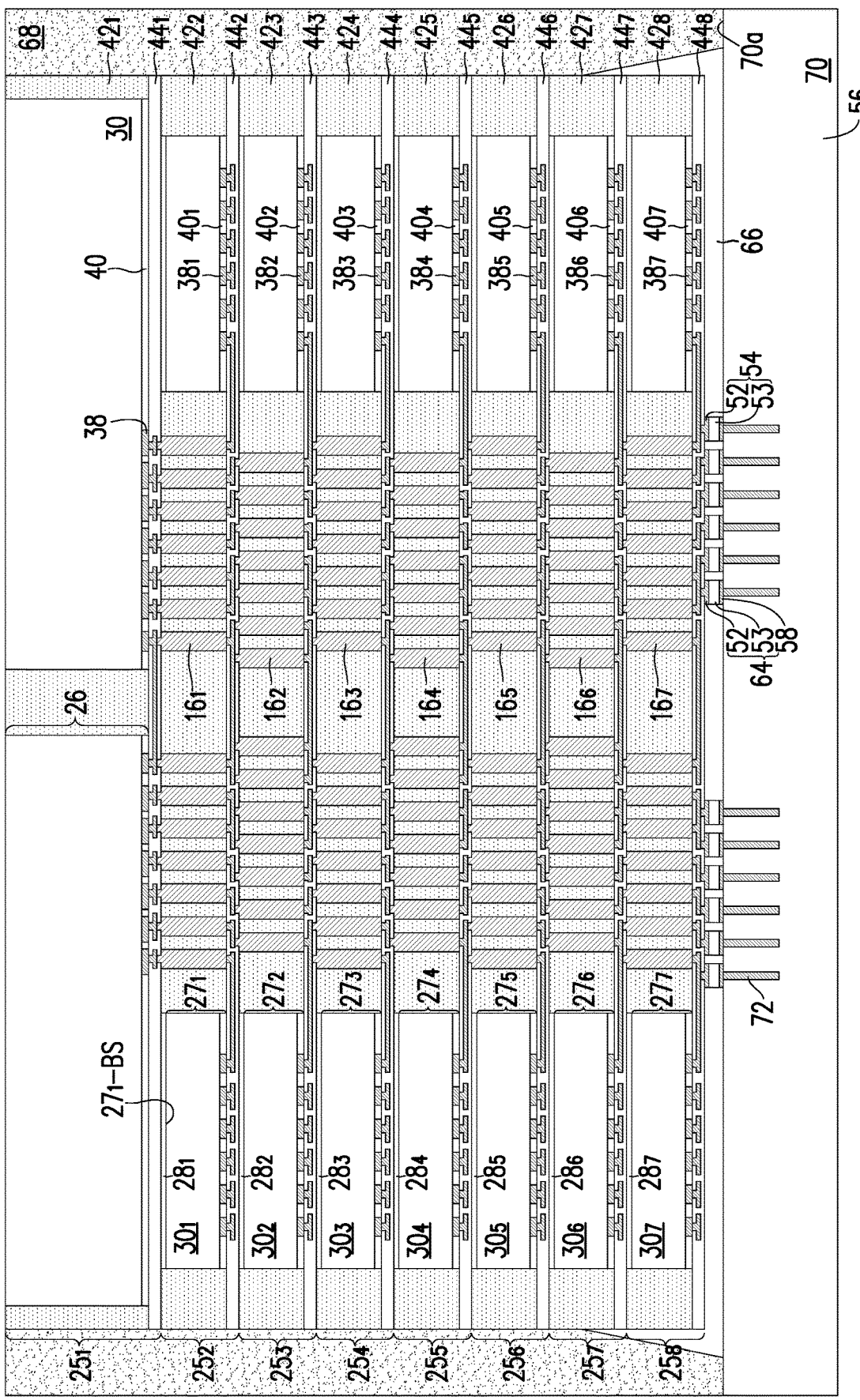

Referring to FIG. 14H, the resulting structure is singulated into a plurality of packages 104A, such that each package 104A includes the IC dies 26 with the respective stack of IC dies $27_1$-$27_7$. In some embodiments, the singulation process may include sawing, laser ablation, etching, a combination thereof, or the like. In other embodiments, the temporary carrier (not shown) may be removed before performing the singulation process. The temporary carrier (not shown) may be removed using a CMP process, a grinding process, an etching process, a combination thereof, or the like.

In some embodiments, the package 104A includes one or more memory dies, such as a stack of memory dies (e.g., DRAM dies, SRAM dies, high-bandwidth memory (HBM) dies, hybrid memory cubes (HMC) dies, or the like). In the stack of memory dies embodiments, the packages 104A may include both memory dies and a memory controller, such as, for example, a stack of four or eight memory dies with a memory controller. Also, in some embodiments, the IC dies 26 and $27_1$-$27_7$ of the package 104A may be in different sizes (e.g., different heights and/or surface areas), and in other embodiments, the IC dies 26 and $27_1$-$27_7$ may be in the same size (e.g., same heights and/or surface areas).

Referring to FIG. 14H, the packages 104A are attached to a first side of the components 56. The components 56 may be an interposer or another die. In embodiments where component 56 is an interposer, the component 56 will generally not include active devices therein, although the interposer may include passive devices formed in and/or on a first surface 70a of a substrate 70 of the components 56. Through-vias (TVs) 72 are formed to extend from the first surface 70a of the substrate 70 into substrate 70. The TVs 72 are also sometimes referred to as through-substrate vias or through-silicon vias when substrate 70 is a silicon substrate. The TVs 72 may be formed by forming recesses in the substrate 70 by, for example, etching, milling, laser techniques, a combination thereof, and/or the like. A thin dielectric material may be formed in the recesses, such as by using an oxidation technique. A thin barrier layer may be conformally deposited over the front side of the substrate 70 and in the openings. The barrier layer may include a nitride or an oxynitride, such as titanium nitride, titanium oxynitride, tantalum nitride, tantalum oxynitride, tungsten nitride, a combination thereof, and/or the like. A conductive material may be deposited over the thin barrier layer and in the openings. The conductive material may be formed by an electro-chemical plating process, CVD, ALD, PVD, a combination thereof, and/or the like. Examples of conductive materials are copper, tungsten, aluminum, silver, gold, a combination thereof, and/or the like. Excess conductive material and barrier layer is removed from the front side of the substrate 70 by, for example, CMP. Thus, the TVs 72 may include a conductive material and a thin barrier layer between the conductive material and the substrate 70.

In some embodiments, the packages 104A are attached to a first side of the components 56 through flip-chip bonding by way of the conductive connectors 54 and the conductive pillars 58 on the components 56 to form conductive joints 64. The conductive pillars 58 may be similar to the conductive pillars 52 and the description is not repeated herein. The packages 104A may be placed on the conductive connectors 54 using, for example, a pick-and-place tool. In some embodiments, the metal cap layers 53 are formed on the conductive pillars 52 (as shown in FIG. 14F), the conductive pillars 58 of the components 56, or both. The conductive joints 64 electrically couple the circuits in the packages 104A through the RDL $44_8$, and the conductive pillars $16_7$ respectively, to TVs 72 in the components 56.

Referring to FIG. 14H, the packages 104A are bonded to the components 56 through a solder bonding or a direct metal to-metal (such as a copper-to-copper or tin-to-tin) bonding. In some embodiments, the packages 104A are bonded to the components 56 by a reflow process. During this reflow process, the conductive connectors 54/58 are in contact with the pads of the RDL structure $44_8$ to electrically couple the packages 104A to the components 56. After the bonding process, an intermetallic compound (IMC) (not shown) may form at the interface of the conductive pillars 52 and the metal cap layers 53, and the interface of the conductive pillars 58 and the metal cap layers 53.

Referring to FIG. 14H, an underfill material 66 is dispensed into the gaps between the packages 104A, and the components 56. The underfill material 66 may extend up along sidewall of the packages 104A. The underfill material 66 may be any acceptable material, such as a polymer, epoxy, molding underfill, or the like. The underfill material 66 may be formed by a capillary flow process after the packages 104A are attached, or may be formed by a suitable deposition method before the packages 104A are attached.

Referring to FIG. 14H, an encapsulant 68 is formed on the various components. The encapsulant 68 may be similar to the encapsulant 142. In some embodiments, the encapsulant 68 includes a molding compound, epoxy, or the like, and may be applied by compression molding, transfer molding, or the like. A curing step is performed to cure the encapsulant 68, such as a thermal curing, an ultra-violet (UV) curing, or the like. In some embodiments, the packages 104A are buried in the encapsulant 68, and after the curing of the encapsulant 68, a planarization step, such as a grinding, may be performed to remove excess portions of the encapsulant 68, which excess portions are over top surfaces of the packages 104A. Accordingly, top surfaces of the packages 104A are exposed, and are level with a top surface of the encapsulant 68.

Referring to FIG. 14, the structure of FIG. 14H is flipped over to prepare for the formation of a second side of components 56. Although not shown, the structure may be placed on carrier or support structure for the process of FIG. 14I. A thinning process is performed on the second side of the substrate 70 to thin the substrate 70 to a second surface 70b until TVs 72 are exposed. The thinning process may include an etching process, a grinding process, the like, or a combination thereof.

Figure 14I:
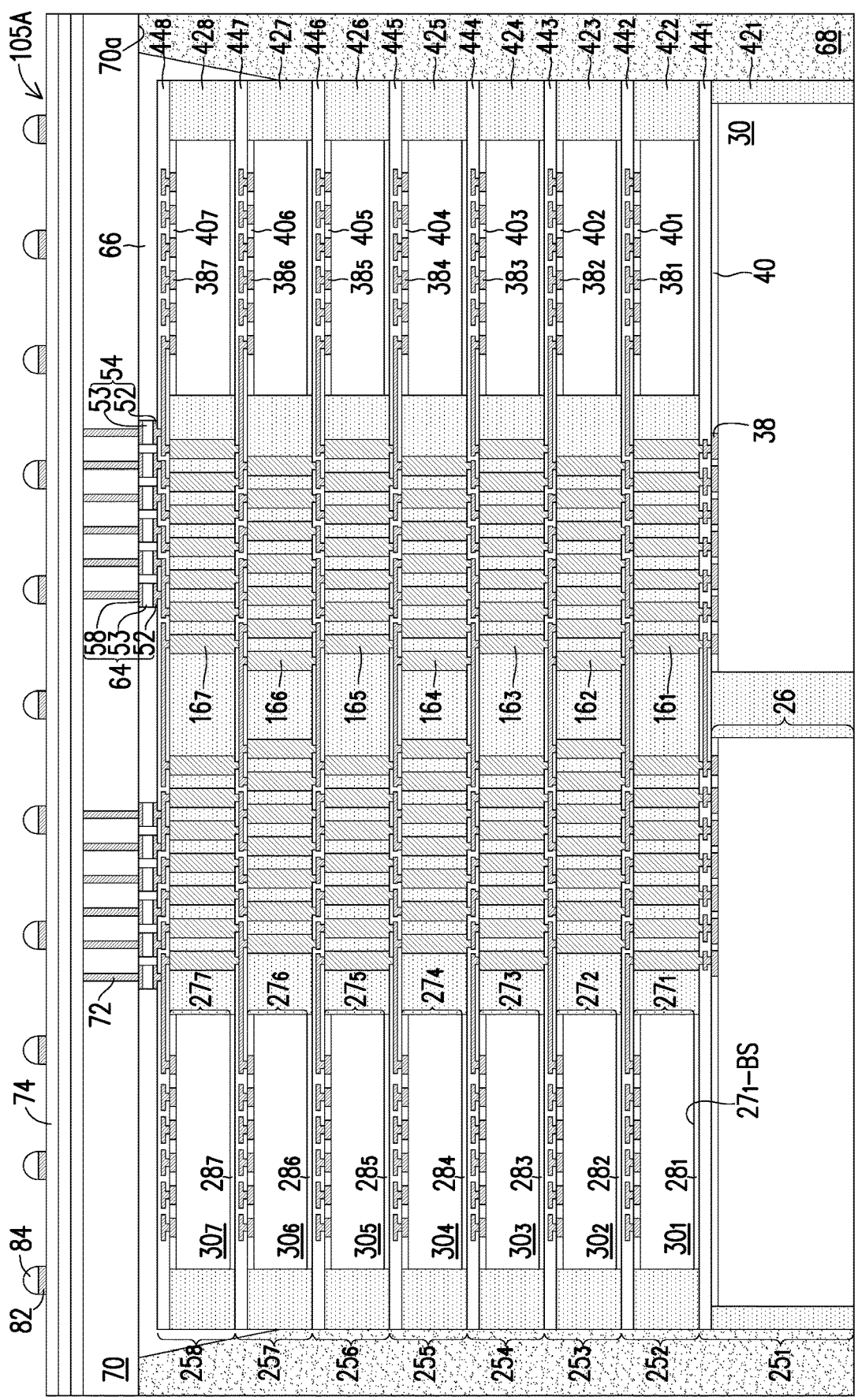

Referring to FIG. 14I, an RDL structure 74 is formed the second surface 70b of the substrate 70. The RDL structure 74 may be formed in a manner similar to similar to the front-side RDL structures 144, 244 or 344, and may be formed of the same material as the front-side RDL structures 144, 244 or 344.

Referring to FIG. 14I, conductive connectors 84 are also formed on the RDL structure 74 and are electrically coupled to TVs 72. In some embodiments, the RDL structure 74 include UBMs 82. In the illustrated embodiment, the UBMs 82 extend through an opening of a dielectric layer of the RDL structure 74 and also extend across the top surface of the redistribution structure. In another embodiment, the UBMs 82 are formed in openings of the dielectric layers of the redistribution structure 74. The UBMs 82 may be formed in manner similar to similar to the UBMs 162, 262 or 362, and may be formed of the same material as the UBMs 162, 262 or 362. The conductive connectors 84 may be formed in manner similar to the conductive connectors 164, 264 or 364, and may be formed of the same material as the conductive connectors 164, 264 or 364. The conductive connectors 84 may be used to bond to an additional electrical component, which may be a semiconductor substrate, a package substrate, a printed circuit board (PCB), or the like. The components 56 are singulated to form component packages 105A comprising, among other things, the package 104A, and the component 56. The singulation may be by sawing, dicing, or the like.

Figure 15:
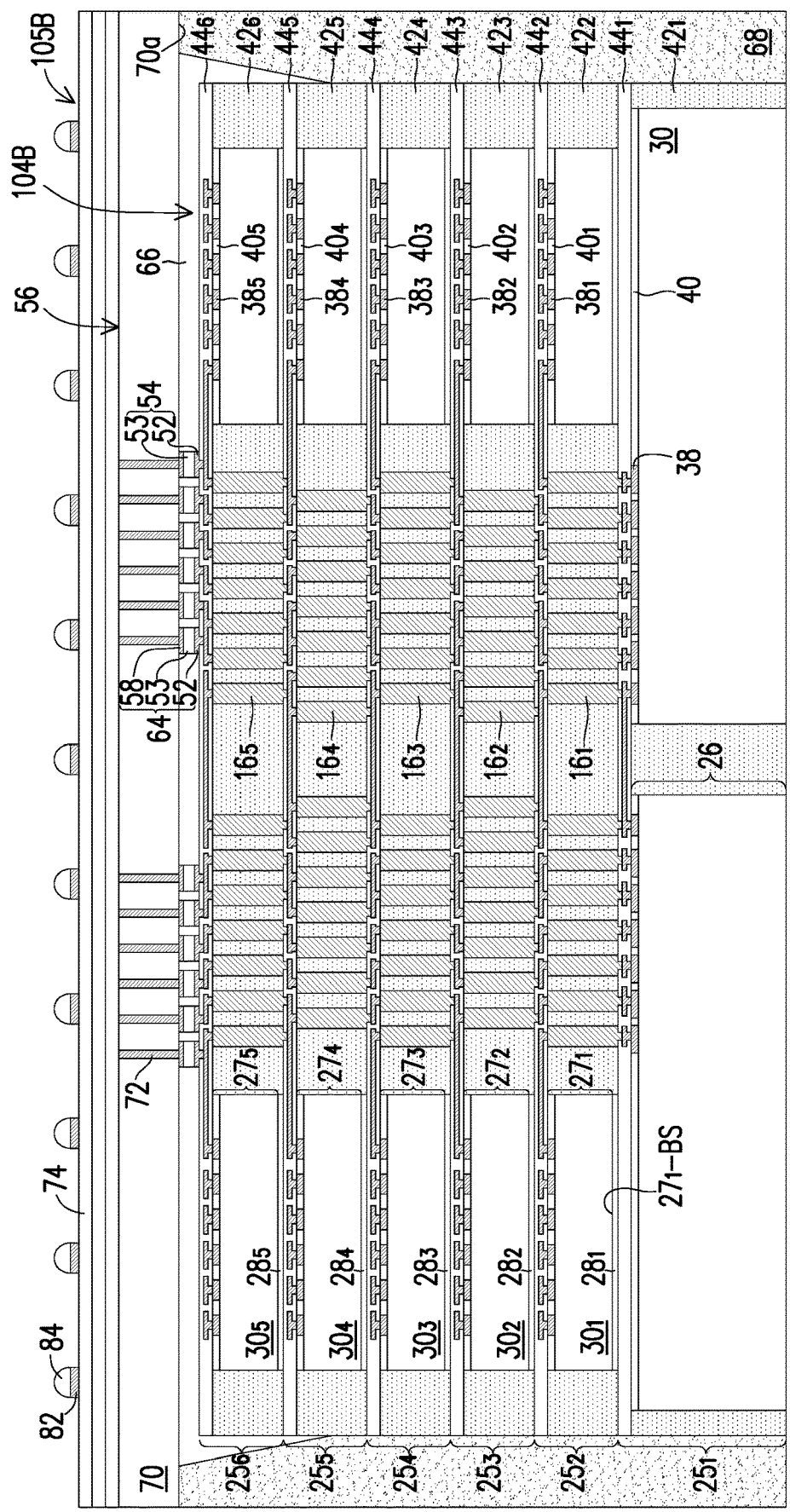
FIGS. 15 and 16 are schematic cross-sectional views illustrating device packages according to some embodiments of the disclosure.
Figure 16:
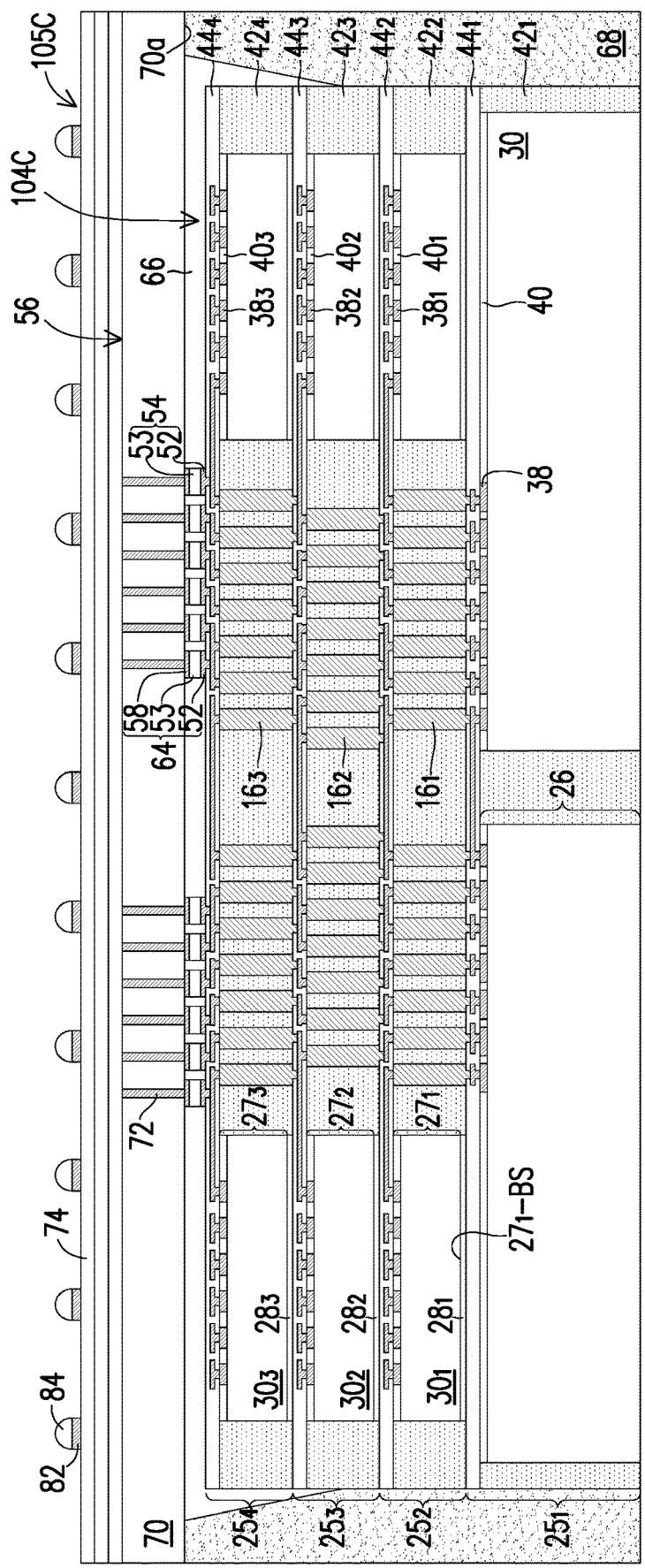

Referring to FIGS. 15 and 16, more or fewer tier structures may be included in component package. For example, component package 105B and 105C are similar to the component package 105A, and the difference is that the component package 105B includes a package 104B, and the component package 104C includes a package 104C, in which the package 104B and 104C each includes fewer tier structures. The package 104B includes a tier 1 structure $25_1$ to a tier 6 structure $25_6$, while the package 104C includes a tier 1 structure $25_1$ to a tier 4 structure $25_4$.

In the embodiment of the present disclosure, an etching solution containing a protective agent having multiple active sides is used during etching the seed layer. The protective agent may protect the surface of the conductive material on the seed layer, so that the etching selectivity between the seed layer and the conductive material may be increased, and the etching process window may be increased. In addition, the embodiments of the present disclosure may also reduce the loss of the width of the conductive material and reduce the damage of the conductive material, thereby not only reducing the surface roughness of the conductive material, but also avoiding electricity property failure and improving the reliability of the component. Therefore, the embodiments of the present disclosure can be applied to the development of a fine-pitch process.

In accordance with some embodiments of the disclosure, a method for forming a conductive feature comprises: forming a seed layer over a substrate; forming a patterned mask layer on the seed layer, wherein the patterned mask layer has an opening exposing the seed layer; forming a conductive material in the opening; removing the patterned mask layer to expose a portion of the seed layer; and removing the portion of the seed layer by using an etching solution comprising a protective agent, thereby forming a conductive feature, wherein the protective agent has multiple active sites to adsorb on the conductive material.

In accordance with alternative embodiments of the disclosure, method for fabricating an integrated circuit comprises: forming a seed layer over a substrate; forming a patterned mask layer on the seed layer, wherein the patterned mask layer has a via opening exposing the seed layer; forming a conductive material in the via opening; removing the patterned mask layer to exposing a portion of the seed layer; and removing the portion of the seed layer and forming a protective layer on a surface and sidewalls of the conductive material by using an etching solution, thereby forming a conductive via, wherein etching solution comprises a protective agent, and the protective agent comprises amine having multiple active sites.

In accordance with some embodiments of the disclosure, a method of forming a package comprising providing a die; forming an encapsulant to at least encapsulate sidewalls of the die; forming a redistribution structure on the die and the encapsulant, comprises: forming a first dielectric layer over the die and the encapsulant; forming a seed layer on the first dielectric layer; forming a patterned conductive layer on the seed layer, wherein a portion of the seed layer is exposed by the patterned conductive layer; and removing the portion of the seed layer and forming a protective layer on a surface and sidewalls of the first conductive material by using an etching solution, thereby forming a plurality of conductive lines, wherein etching solution comprises a protective agent, and the protective agent comprises amine having multiple active sites.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for forming a conductive feature, comprising:
forming a seed layer over a substrate;
forming a patterned mask layer on the seed layer, wherein the patterned mask layer has an opening exposing the seed layer;
forming a conductive material in the opening;
removing the patterned mask layer to expose a portion of the seed layer; and
removing the portion of the seed layer by using an etching solution comprising a protective agent, thereby forming the conductive feature, wherein the protective agent has multiple active sites to adsorb on the conductive material,
wherein during the removing the portion of the seed layer, an etch rate of the conductive material is less than an etch rate of the seed layer.

2. The method of claim 1, wherein the protective agent has a structure represented by a following formula:

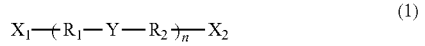
(1)

wherein $X_1$, $X_2$ and Y have the multiple active sites, and each of the $R_1$, and $R_2$ comprise an alkyl group, and n is an integer of 1 to 200.

3. The method of claim 1, wherein the protective agent has a structure represented by a following formula (1):

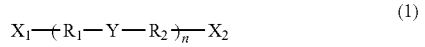
(1)

each of $X_1$ and $X_2$ independently represents —NH$_2$, —SH, —CN, —OH, —COOH,
Y represents —NH—, —NR$_3$—, —S—, —O—, or —COO—,
each of $R_1$, $R_2$ and $R_3$ independently represents a substituted or unsubstituted linear or branched alkyl group having 1 to 10 carbon atoms, a substituted or unsubstituted linear or branched alkynyl group having 2 to 10 carbon atoms, a substituted or unsubstituted linear or branched alkenyl group having 2 to 10 carbon atoms, a substituted or unsubstituted aryl group having 2 to 10 carbon atoms, a substituted or unsubstituted ester group having 2 to 10 carbon atoms, a substituted or unsubstituted ether group having 2 to 10 carbon atoms, or their derivatives; and
n is an integer of 1 to 200.

4. The method of claim 1, wherein the protective agent comprises an amine and the multiple active sites comprise nitrogen atoms, oxygen atoms, sulfur atoms or a combination thereof.

5. The method of claim 1, wherein the multiple active sites comprise nitrogen atoms, and a ratio of a number of nitrogen atoms to a number of carbon atoms in the protective agent is greater than 0.08.

6. The method of claim 1, wherein the patterned mask layer has an aspect ratio less than 5.

7. A method for fabricating an integrated circuit, comprising:
forming a seed layer over a substrate;
forming a patterned mask layer on the seed layer, wherein the patterned mask layer has a via opening exposing the seed layer;
forming a conductive material in the via opening;
removing the patterned mask layer to exposing a portion of the seed layer; and
removing the portion of the seed layer and forming a protection layer on a surface and sidewalls of the conductive material by using an etching solution, thereby forming a conductive via, wherein the etching solution comprises a protective agent, and the protective agent comprises amine having multiple active sites.
wherein the amine having multiple active sites has a structure represented by following formula (2) or (3):

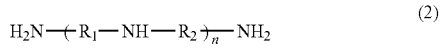
(2)

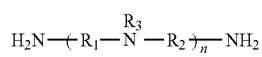
(3)

wherein each of $R_1$, $R_2$ and $R_3$ independently represents a substituted or unsubstituted linear or branched alkyl group having 1 to 10 carbon atoms, a substituted or unsubstituted linear or branched alkynyl group having 2 to 10 carbon atoms, a substituted or unsubstituted linear or branched alkenyl group having 2 to 10 carbon atoms, a substituted or unsubstituted aryl group having 2 to 10 carbon atoms, a substituted or unsubstituted ester group having 2 to 10 carbon atoms, a substituted or unsubstituted ether group having 2 to 10 carbon atoms, or their derivatives; and
n is an integer of 1 to 200.

8. The method of claim 7, wherein the amine comprises diethylenetriamine, tris(2-aminoethyl) amine, tetraethylenepentamine, or a combination thereof.

9. The method of claim 7, further comprising:
before the forming the seed layer, forming a pad over the substrate; and forming a passivation film over the substrate and exposing a portion of the pad, wherein the conductive via forms a die connector to electrically connect to the pad; and after the forming the conductive via, forming a dielectric material on the passivation films and on the conductive via; and performing a singulation to separate the substrate into a plurality of dies.

10. The method of claim 7, further comprising:
attaching a die over the substrate and laterally aside the conductive via;
forming an encapsulant laterally encapsulate the conductive via and the die, wherein the conductive via forms a through via penetrating the encapsulant;
forming a redistribution structure on first sides of the die, the through via and the encapsulant;
forming a plurality of first conductive connectors to electrically connect to the die through the redistribution structure;
performing de-bonding to detach the substrate from the encapsulant; and
forming a plurality of second conductive connectors to electrically connect to the through via.

11. The method of claim 7, further comprising:
before the forming the seed layer, attaching a die over the substrate, and forming an encapsulant laterally encapsulate the die,
wherein the conductive via is a via of a redistribution structure to electrically connect to the die;
forming a dielectric layer over the conductive via, the die, and the encapsulant; and
performing a planarization process on the dielectric layer.

12. A method of forming a package, comprising:
providing a die;
forming an encapsulant to at least encapsulate sidewalls of the die;
forming a redistribution structure on the die and the encapsulant, comprising:
  forming a first dielectric layer over the die and the encapsulant;
  forming a seed layer on the first dielectric layer;
  forming a patterned conductive layer on the seed layer, wherein a portion of the seed layer is exposed by the patterned conductive layer; and
  removing the portion of the seed layer and forming a protection layer on a surface and sidewalls of the patterned conductive layer by using an etching solution, thereby forming a plurality of conductive lines, wherein etching solution comprises a protective agent, and the protective agent comprises polyamine having multiple active sites,
  wherein during the removing the portion of the seed layer, an etch rate of the patterned conductive layer is less than an etch rate of the seed layer.

13. The method of claim 12, wherein the polyamine comprises a secondary polyamine, a tertiary polyamine, and a combination thereof.

14. The method of claim 13, wherein the secondary polyamine comprises diethylenetriamine, and tetraethylenepentamine, and the tertiary polyamine comprises tris(2-aminoethyl) amine.

15. The method of claim 12, further comprising:
before the forming the seed layer, forming a plurality of via openings in the first dielectric layer,
wherein the seed layer and the patterned conductive layer further filling into the via opening to form the plurality of conductive lines and a plurality of first vias.

16. The method of claim 12, further comprising:
forming a plurality of second vias on the patterned conductive layer;
forming a second dielectric layer to cover the plurality of second vias, the plurality of conductive lines and the first dielectric layer; and
performing a planarization process on the second dielectric layer.

17. The method of claim 16, wherein the first dielectric layer and the second dielectric layer comprises a same material.

18. The method of claim 17, wherein the first dielectric layer comprises a polymer, and the second dielectric layer comprises a composite material including a base material and a plurality of fillers in the base material.

19. The method of claim 6, wherein the patterned mask layer has an aspect ratio less than 5.

20. The method of claim 12, further comprising:
before forming the patterned conductive layer, forming a patterned mask layer on the seed layer, wherein the patterned mask layer has an aspect ratio less than 5.

* * * * *